(12) United States Patent
Mick et al.

(10) Patent No.: US 7,713,053 B2
(45) Date of Patent: May 11, 2010

(54) REUSABLE TEMPLATE FOR CREATION OF THIN FILMS; METHOD OF MAKING AND USING TEMPLATE; AND THIN FILMS PRODUCED FROM TEMPLATE

(75) Inventors: Stephen E Mick, Apex, NC (US); John Damiano, Jr., Raleigh, NC (US); David P. Nackashi, Raleigh, NC (US)

(73) Assignee: Protochips, Inc., Raleigh, NC (US)

( * ) Notice: Subject to any disclaimer, the term of this patent is extended or adjusted under 35 U.S.C. 154(b) by 1355 days.

(21) Appl. No.: 11/150,382

(22) Filed: Jun. 10, 2005

(65) Prior Publication Data
US 2006/0277778 A1    Dec. 14, 2006

(51) Int. Cl.
B28B 13/00    (2006.01)

(52) U.S. Cl. .............................. 425/436 R; 249/114.1; 249/115; 264/220

(58) Field of Classification Search ............. 425/436 R, 425/256, 470, DIG. 58; 33/562; 249/114.1, 249/115; 264/220
See application file for complete search history.

(56) References Cited

U.S. PATENT DOCUMENTS

| | | | |
|---|---|---|---|
| 2,347,965 A | 5/1944 | Ramberg | |
| 2,572,497 A | 10/1951 | Law | |
| 2,875,341 A | 2/1959 | Nesh | |
| 4,022,927 A * | 5/1977 | Pfeiffer et al. | 430/5 |
| 4,163,900 A | 8/1979 | Warren et al. | |
| 4,250,127 A | 2/1981 | Warren et al. | |
| 4,543,266 A | 9/1985 | Matsuo et al. | |
| 4,919,749 A | 4/1990 | Mauger et al. | |
| 4,978,421 A | 12/1990 | Bassous et al. | |
| 5,004,920 A | 4/1991 | Lee et al. | |
| 5,544,218 A | 8/1996 | Turner et al. | |
| 5,572,026 A | 11/1996 | Ikeda | |
| 5,639,488 A * | 6/1997 | Nakano et al. | 425/444 |
| 5,788,853 A | 8/1998 | Zenhausern | |

(Continued)

OTHER PUBLICATIONS

Ermantraut, E; Wolfhart, K; and Tichelaar, W, "Perforated support foils with pre-defined hole size, shape and arrangement," Ultramicroscopy 74 (1998), pp. 75-81. (7 pages).

(Continued)

Primary Examiner—Khanh Nguyen
Assistant Examiner—Saeed M Huda
(74) Attorney, Agent, or Firm—Tristan A. Fuierer; Moore & Van Allen, PLLC

(57) ABSTRACT

The present invention is directed generally to templates used in the creation of thin-film replicas, for example, the creation of thin films, such as carbon films, for use as specimen support in electron-beam specimen analysis. More specifically, the present invention is directed to novel reusable patterned templates, the methodology of making these reusable templates, the templates made from such methodologies, the use and reuse of these templates to make thin films of any type for any purpose, and the thin films made from these templates. A feature of the novel template of the present invention is in its employment of one or more zones of discontinuity, or undercuts, associated with the patterns transferred into the template to allow for the removal of the thin film from the template without sacrificing the structural integrity of the template to prevent at least one re-use of the template.

36 Claims, 15 Drawing Sheets

U.S. PATENT DOCUMENTS

| | | | |
|---|---|---|---|
| 5,821,544 | A | 10/1998 | Augustus et al. |
| 5,831,184 | A | 11/1998 | Willard et al. |
| 6,140,652 | A * | 10/2000 | Shlepr et al. ........... 250/440.11 |
| 6,616,784 | B2 | 9/2003 | Chang et al. |
| 6,645,744 | B2 | 11/2003 | Ermantraut et al. |
| 6,821,692 | B1 | 11/2004 | Ermantraut et al. |

OTHER PUBLICATIONS

Downing, K, "Support Films with Uniform Hole Size," Microscopy Today, 11(5), p. 54, 2003. (1 page).

Harris, P. J. F., "Carbonaceous Contaminants on Support Films for Transmission Electron Microscopy", Carbon, 1, 2000. (5 pages).

Forslind, Bo, "Replication Techniques for Dry and Wet Biological Surfaces", Scanning Microscopy, 13(1), pp. 133-139, 1999. (7 pages).

Agar, A. W., et al., "Replica Techniques in Electron Microscopy", British Journal of Applied Physics, 2(1), 1951, pp. 8-11. (4 pages).

Challice, C. E., et al., "The Production of Specimen Mounting Grids for the Electron Microscope", British Journal of Applied Physics, 3(12), 1952, pp. 384-385. (2 pages).

Bradley, D. E., "An Evaporated Carbon Replica Technique for use with the Electron Microscope and its Application to the Study of Photographic Grains", British Journal of Applied Physics, 5(3), 1954, pp. 96-97. (2 pages).

Smith, E., et al., "Direct Carbon Replicas from Metal Surfaces", British Journal of Applied Physics, 7(6), 1956, pp. 214-217. (4 pages).

Boswell, F. W. C., "Use of B2O3 as a Parting Layer for 'Direct' Replicas in Electron Microscopy", Review Scientific Instruments, 28, 1957, pp. 723-724. (2 pages).

Matthews, J., et al., "Carbon Films for Electron Microscopy", Review Scientific Instruments, 35, 1963, p. 592. (1 page).

Münch, G. "Simplified Preparation Method for Carbon Replicas and Carbon Film for Specimen Support in Electron Microscopy", Review Scientific Instruments, 36, 1964, p. 524. (1 page).

Baumeister, W., et al., "Preparation of Perforated Films with Predeterminable Hole Size Distributions", Micron, 7, 1976, pp. 49-54. (6 pages).

Chiu, W., et al., "Factors Affecting High Resolution Fixed-Beam Transmission Electron Microscopy", Ultramicroscopy, 2, 1977, pp. 207-217. (11 pages).

Iijima, S., "Thin Graphite Support Films for High Resolution Electron Microscopy", Micron, 8, 1977, pp. 41-46. (6 pages).

Little, J. W., et al., "Free-standing Photoresist Films for Microlithography", Review of Scientific Instruments, 51(11), 1980, pp. 1581-1583. (3 pages).

Enquist, F., "The Fabrication of Amporphous SiO2 Substrates Suitable for Transmission Electron Microscopy Studies of Ultrathin Polycrystalline Films", Thin Solid Films, 145, 1986, pp. 99-104. (6 pages).

Zandbergen, H. W., "Highly Temperature-Stable Si3N4 Perforated Grids", Ultramicroscopy, 24, 1988, pp. 45-48. (4 pages).

Toyoshima, C., "On the Use of Holey Grids in Electron Crystallography", Ultramicroscopy, 30, 1989, pp. 439-444. (5 pages).

Butt, H. J., et al., "Effect of Surface Roughness of Carbon Support Films on High-Resolution Electron Diffraction of Two-Dimensional Protein Crystals", Ultramicroscopy, 26, 1991, pp. 307-318. (12 pages).

Glaesar, R. M., "Specimen Flatness of Thin-Crystalline Arrays: Influence of the Substrates", Ultramicroscopy, 46, 1992, pp. 33-43. (11 pages).

Reznik, G., et al., "A Technique for Fabrication of Textured Thin Carbon Substrates", Ultrramicroscopy, 40, 1992, pp. 181-185. (5 pages).

Booy, F., et al., "Cryo-crinkling: What Happens to Carbon Films on Copper Grids at Low Temperature", Ultramicroscopy, 48, 1993, pp. 273-280. (8 pages).

Schmutz, M., et al., "Defects of Planarity of Carbon Films Supported on Electron Microscopy Grids Revealed by Reflected Light Microscopy", Journal of Structural Biology, 112, 1993, pp. 252-258. (7 pages).

Schmutz, M., et al., "Analysis of Carbon Film Planarity by Reflection Light Microscopy", Ultramicroscopy, 63, 1996, pp. 263-272. (10 pages).

Vonck, J., "Parameters Affecting Specimen Flatness of Two-dimensional Crystals for Electron Crystallography", Ultramicroscopy, 85, 2000, pp. 123-129 (7 pages).

Koning, R. I., et al., "Preparation of Flat Carbon Support Films", Ultramicroscopy 94, 2003, pp. 183-191. (9 pages).

"Support films for electron microscopy", Quantifoil Micro Tools GmbH, brochure, copyright 2003, from website quantifoil.com, (8 pages).

"Quantifoil® support films for electron microscopy", Quantifoil Micro Tools GmbH, brochure, copyright 2003, from website quantifoil.com, (1 page).

Excerpts from website of Quantifoil Micro Tools GmbH (quantifoil.com), printed Aug. 31, 2005, (12 pages).

* cited by examiner

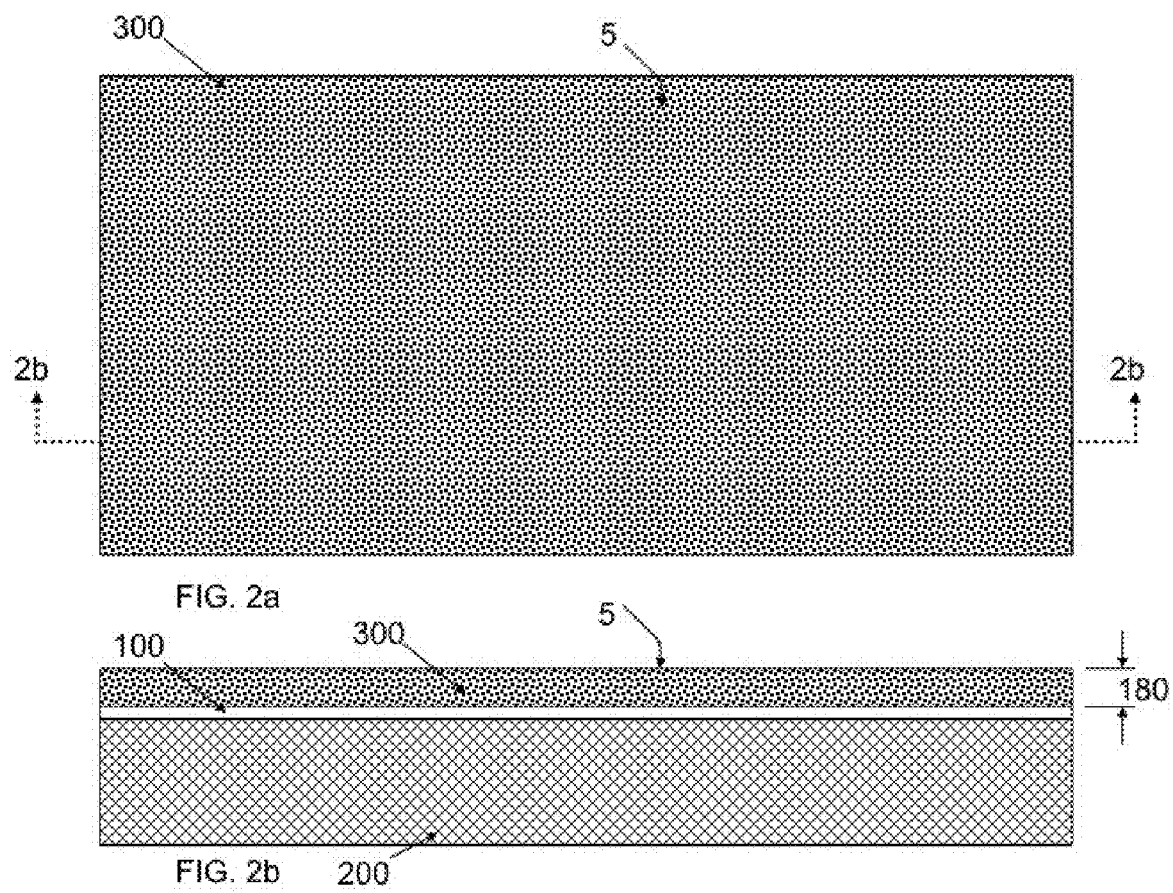

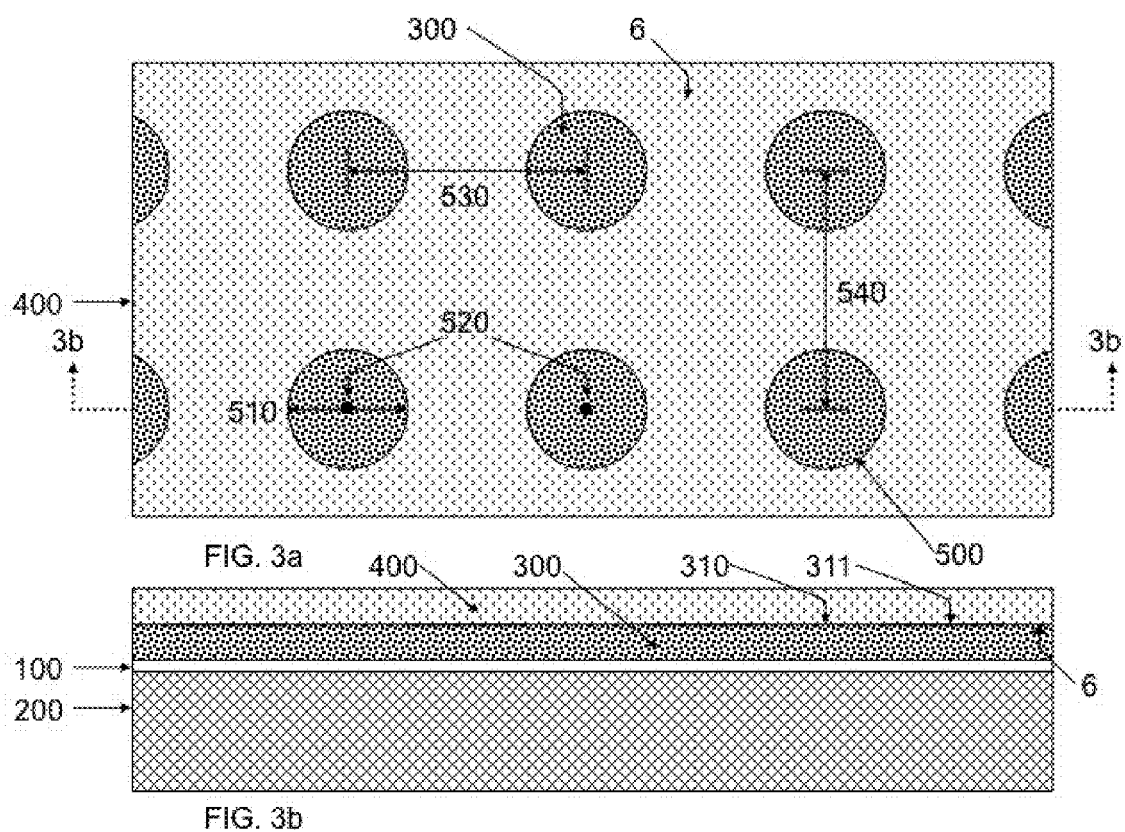

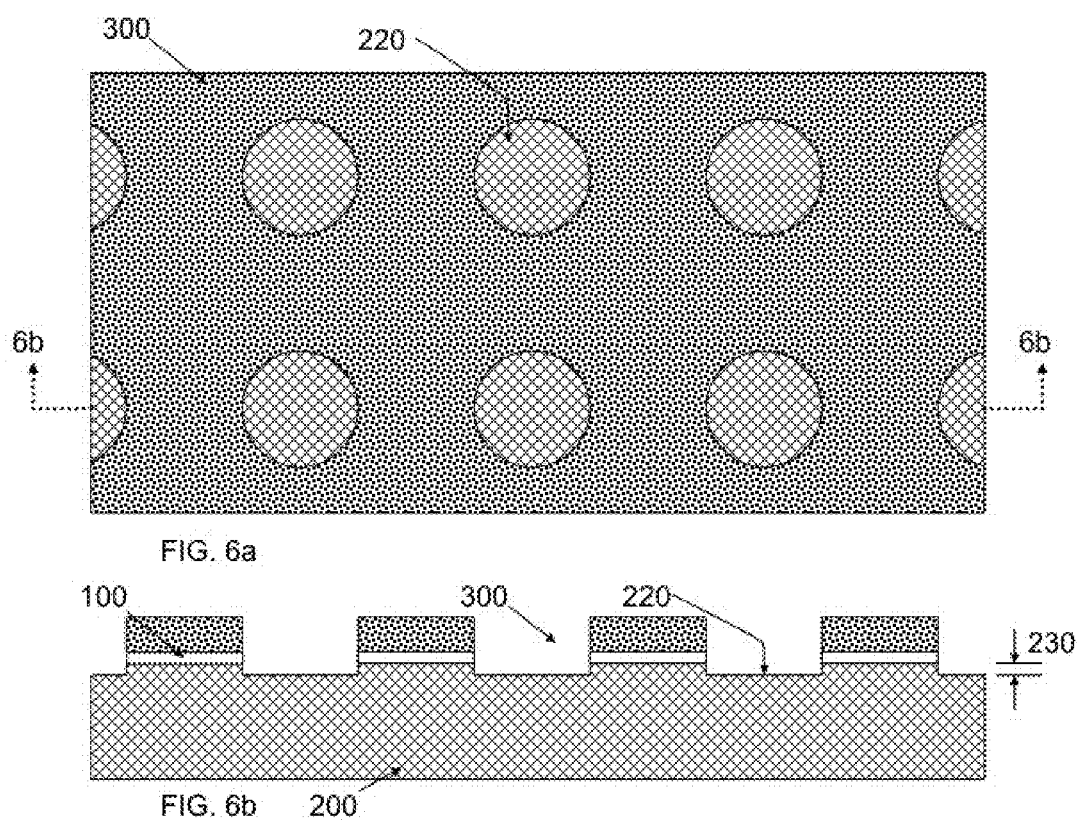

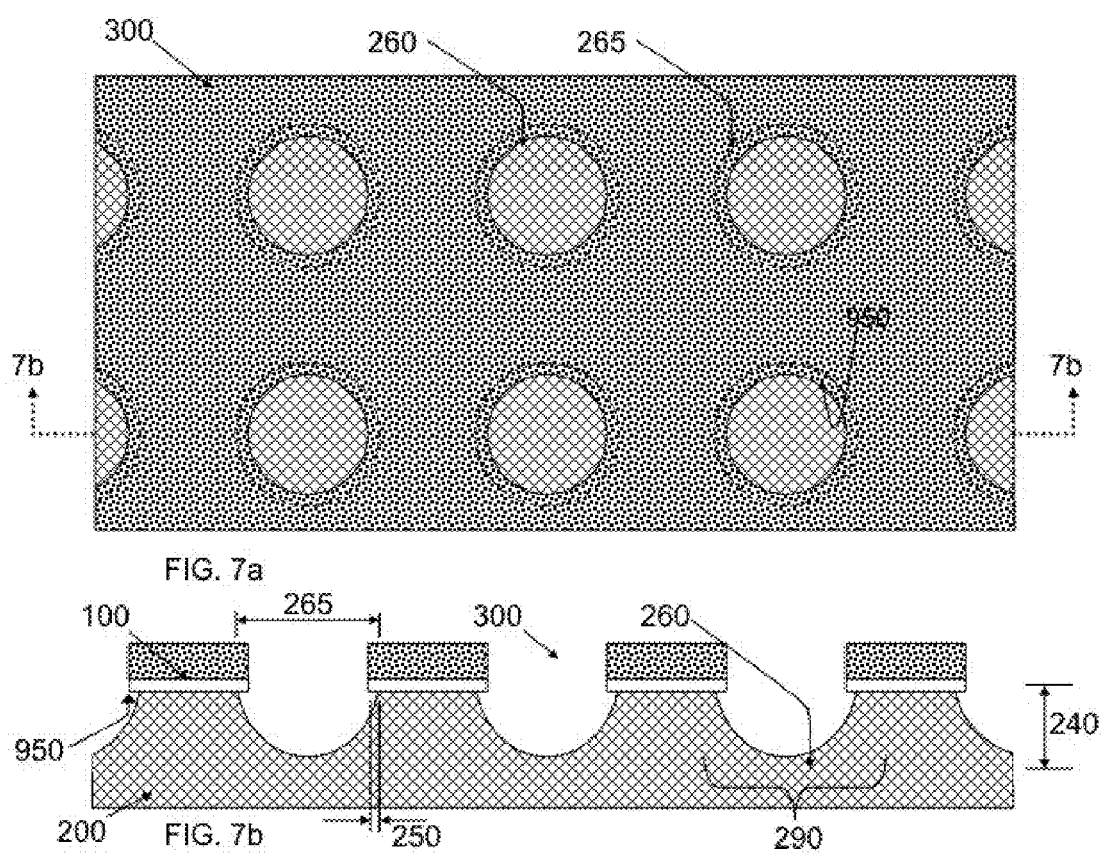

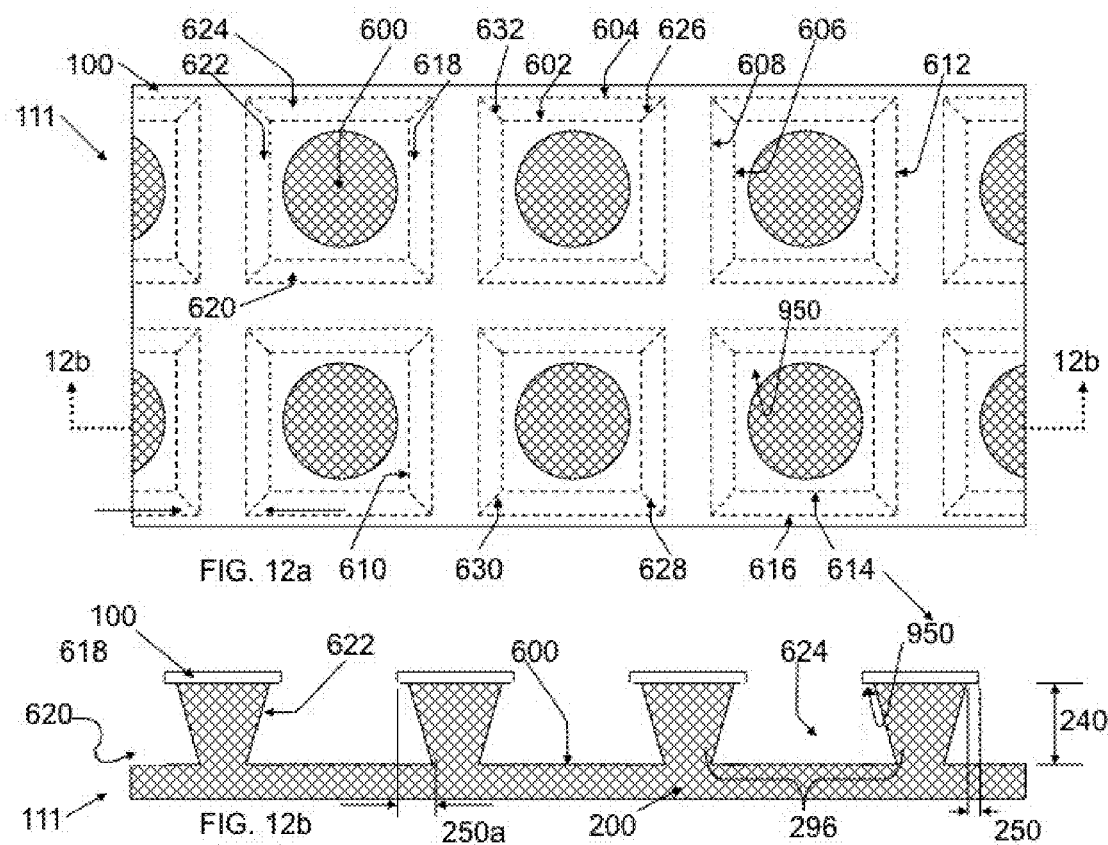

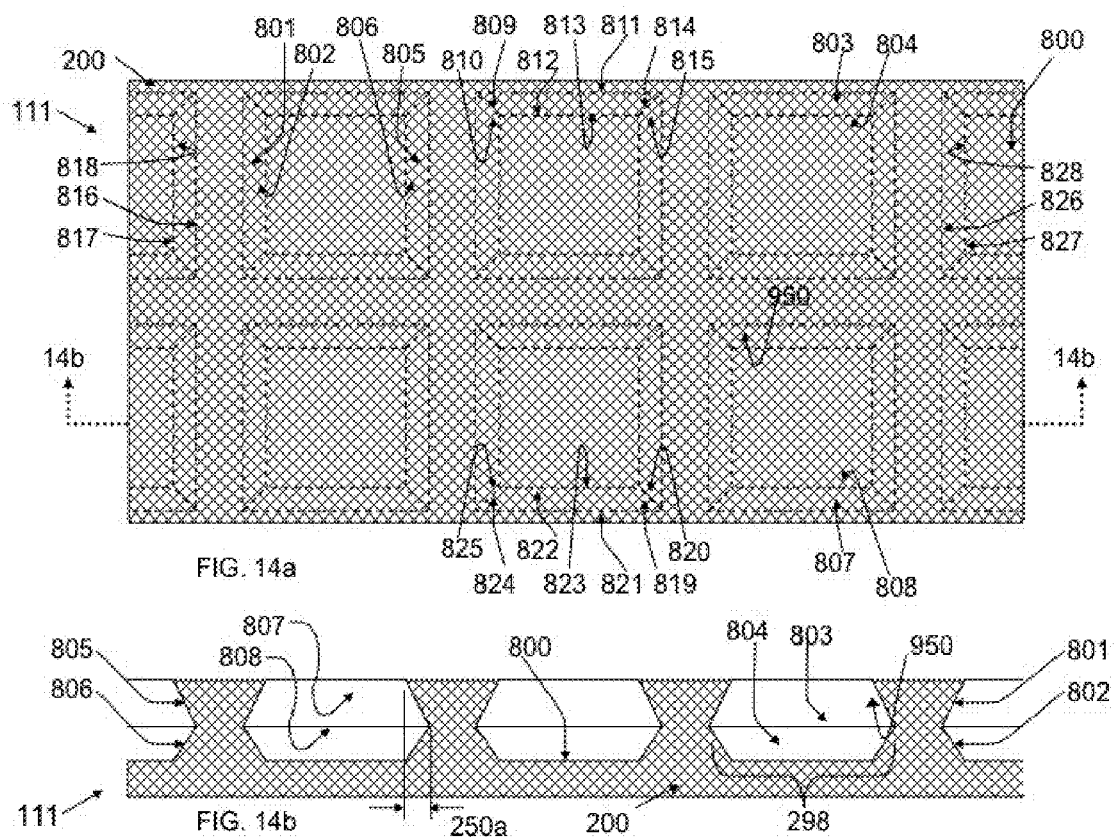

REUSABLE TEMPLATE FOR CREATION OF THIN FILMS; METHOD OF MAKING AND USING TEMPLATE; AND THIN FILMS PRODUCED FROM TEMPLATE

CROSS-REFERENCE TO RELATED APPLICATIONS

Not applicable.

STATEMENT REGARDING FEDERALLY SPONSORED RESEARCH OR DEVELOPMENT

Not Applicable.

BACKGROUND OF THE INVENTION

The present invention is directed generally to templates used in the creation of thin-film replicas, for example, the creation of thin films, such as carbon films, for use as specimen support in electron-beam specimen analysis. More specifically, the present invention is directed to novel reusable templates, the methodology of making these reusable templates, the templates made from such methodologies, the use and reuse of these templates to make thin films of any type for any purpose, and the thin films made from these templates.

Several issued U.S. patents provide a background for structures and methods of making replicas. For example, U.S. Pat. No. 2,347,965 to Ramberg discloses a method to make a replica of the surface of an opaque specimen through a two-step positive replication process for examination with a transmission electron microscope. In the disclosed process a specimen is first coated with a thick amount of metal. The thick metal coating is mechanically stripped from the specimen and coated with a thin replicating material. The replica is completed by chemically dissolving the metal to leave only the thin replicating material. Thus, the negative metal replica of the specimen surface is destroyed and can be used to create only one positive replica.

U.S. Pat. No. 2,572,497 to Law discloses a method to make a positive silica replica of a copper mesh. In this patent, a copper mesh serves as a template for creating a silica mesh. As the process is described, the silica mesh is completed by etching away the underlying copper mesh. The copper mesh template is destroyed in the manufacture of the silica replica and can therefore only be used one time.

U.S. Pat. No. 2,875,341 to Nesh discloses a method for making a replica of a metallic surface through a two-step positive replication process. The process disclosed in the patent requires that a metallic object to be replicated have the shape of the inner edge of a ring or can be cut to have said shape. In the first step of the replication process, a plastic replica of the metallic surface is made whereby plastic is applied to the metallic surface, and as the plastic dries, it shrinks and separates itself from the metallic surface. The plastic mold of the surface is then evaporated with silica and possibly other masking materials. Finally, the plastic is dissolved from the silica replica with solvents. Accordingly each plastic mold from the surface can be used to create only one replica.

U.S. Pat. No. 4,250,127 to Warren, et al., discloses a method to make a specimen support grid for x-ray analysis as a negative replica from a mold etched into a surface. The grid disclosed in this patent is created by casting a carbon material into a mold and etching away the mold once the casting is completed. Thus the mold (or template) disclosed in this patent is destroyed as a consequence of the process for making the grid.

U.S. Pat. No. 5,004,920 to Lee, et al., discloses a method to collect asbestos from a sample of air. In the disclosed process, a volume of air containing an asbestos sample to be collected is passed through a filter. The filter with the collected sample is affixed to a glass slide, coated with carbon both to form a negative replica of the surface and to trap the asbestos specimen, and then cut into small sections. The negative replica is completed by submersing a small section in solvent to dissolve the filter and thereby release the replica with embedded asbestos.

U.S. Pat. No. 6,645,744 to Ermantraut, et al., discloses a bath used to selectively etch layers of a microstructure wherein the bath consists of at least one biogenic agent. U.S. Pat. No. 6,821,692 also to Ermantraut, et al., discloses a method to create a self-supported novolac (i.e. photoresist) structure by the process of depositing, patterning, and releasing the structure from a substrate. See also, Ermantraut, E; Wolfhart, K; and Tichelaar, W, "Perforated support foils with pre-defined hole size, shape and arrangement," Ultramicroscopy 74 (1998), pp 75-81 describing the usage of the technology described in these two patent references. Perforated support foils with holes of pre-defined size, shape and arrangement and with hole sizes down to the sub-micrometer range, named Quantifoil®, are presented. The foils are fabricated using semiconductor lithographic techniques. A sacrificial layer that consists of a biopolymer, i.e. glutaraldehyde cross-linked gelatin, is used. This layer is removed by proteinase treatment, thus introducing an enzymatic reaction as a tool in microsystems technology. The foils are particularly beneficial in electron microscopy, when a specimen support is required with holes smaller than those attainable with metal grids (~10 µm). Foils with a specific hole size and arrangement permit a further automation of electron microscopic (EM) data acquisition procedures.

Additionally, Downing, K, "Support Films with Uniform Hole Size," Microscopy Today, 11(5), p. 54, 2003 describes a method for producing a uniform distribution of holes that are all of the same size in holey carbon films mounted on standard EM grids used as specimen supports in electron cryo-microscopy. The resulting grids are described as being a very effective intermediate between holey films made with the various solvent techniques, which produce random hole sizes, and commercial Quantifoil® grids, which have uniform holes on a regular lattice.

However, the current state-of-the-art does not provide a template structure that allows for a positive replica to be created in a single step while preserving the template for reuse (i.e., the template is not sacrificed, destroyed or otherwise damaged during the removal of the replica). Moreover the prior art templates do not allow for precise control over the thickness and type of material used to form the replica. Nor can the prior art templates can be custom created to have features for replication down to the nanometer scale where the features can be precisely manufactured and transferred into the replica as a pattern of any complexity. Further, the there exists a need for the formation of thin film replicas from a template that can be accomplished on a large scale not requiring the template to but cut into small sections.

BRIEF SUMMARY OF THE INVENTION

The present invention addresses the need mentioned above by providing a template structure that allows for a positive replica to be created in a single step while preserving the template for reuse. The present invention also allows for precise control over the thickness and type of material used to form the replica. The novel templates of the present invention described herein can be custom created to have features for replication down to the nanometer scale where the features can be precisely manufactured and transferred into the replica as a pattern of any complexity. Further, the present invention provides for the formation of thin film replicas from the novel template that can be accomplished on a large scale not requiring the template to be cut into small sections. The present invention provides novel undercut profiles in the template to cause a discontinuity to exist in any thin film that is deposited upon the template structure thereby allowing the surface features to be replicated in the thin film. Moreover, the discontinuity in the deposited film resulting from the undercut profile provides a mechanism for a solution to dissolve a release layer that is deposited between the surface material and a subsequently deposited thin film layer.

In a preferred embodiment of the present invention, there is described a reusable template for use in creating thin films comprising a base structure having a top surface, a bottom surface and a thickness defined as the distance between the top surface and the bottom surface; one or more patterns in the top surface of the base; and one or more cavities extending from the aperture perimeter boundaries into the thickness of the base structure. The patterns each have a respective aperture having a desired aperture shape defining a desired perimeter boundary at the top surface of the base. The cavities have a shape defined by one or more internal wall surfaces extending into the thickness of the base and have a region of discontinuity between said one or more cavities and their respective one or more aperture perimeter boundaries. In a preferred embodiment, the plurality of patterns being oriented in spaced relationship with one another and/or in a regular array of aperture shapes.

The composition of the base could be any advantageous material, such as an amorphous substrate material, a crystalline material, such as for example, silicon, or other lattice structured material. The base could be comprised of multiple layers in stacked-up orientation to increase manufacturing yield. In a preferred embodiment, the base further comprises a multilayered structure having a surface layer comprised of a surface layer material and a substrate layer comprised of a substrate layer material. In a preferred embodiment, the surface layer has a topside and an underside, the surface layer underside being in contact with the subsurface layer. The surface layer contains these apertures and the subsurface layer contains the cavities, these cavities having a region of discontinuity between themselves and the surface layer apertures. The region of discontinuity preferably comprises an undercut.

The undercut can comprise a region of the cavity walls proximate the aperture perimeter boundary where such walls have a substantially retrograde slope. The undercut can also comprise a region of the surface layer forming a lip at the aperture perimeter boundary, the lip comprising a topside face, an underside face substantially underneath the topside face, and a depth, the underside face having an outer boundary, and an inner boundary. The lip underside face has a length defined as the distance between the outer and inner boundaries, the lip underside face inner boundary contacting the cavity substrate layer. The lip underside face inner boundary preferably contacts said cavity substrate layer in a region where said cavity walls have a substantially retrograde slope. The lip underside face inner boundary also can contact the cavity substrate layer in a region where the cavity walls have a substantially re-entrant slope.

In yet another preferred embodiment of the present invention, there is also described a preferred method of manufacturing reusable thin film templates comprising the steps of: creating a thin film template workpiece having one or more layers of desired composition, said workpiece having a top surface, a bottom surface and a depth; transferring patterned features from a pattern master into the surface of the template workpiece to create one or more patterned apertures having a desired aperture shape defining a desired perimeter boundary in the top surface of the workpiece; and creating one or more cavities (as described herein) extending from said one or more aperture perimeter boundaries into the thickness of the workpiece.

In a further preferred embodiment, there is disclosed a method of manufacturing reusable thin film templates comprising the steps of: creating a thin film template workpiece having one or more layers of desired composition, the workpiece having a top surface, a bottom surface and a depth; applying a photoresist layer to the top surface of the workpiece; placing a photomask, containing one or more desired array of patterned features, proximate the surface of the photoresist layer; transferring the patterned features of the photomask into the photoresist layer such that the photoresist layer is now absent in the area of the patterned features, thereby exposing the top surface of the workpiece in the area of the patterned features; removing the photomask from proximity with the workpiece; transferring the patterned features into the surface of the template workpiece to create one or more patterned apertures having a desired aperture shape defining a desired perimeter boundary in the top surface of the workpiece; and creating one or more cavities (as described herein) extending from said one or more aperture perimeter boundaries into the thickness of the workpiece. In another embodiment, the photoresist layer is removed.

There is also described herein as a preferred embodiment, a thin film template whenever obtained by the processes described herein.

Additionally, as another preferred embodiment, there is described a method of manufacturing thin films comprising the steps of: coating a reuseable thin film templates as described herein with a release layer; applying the desired thin film to the release layer; and releasing the thin film from the release layer without sacrificing the structural integrity of the thin film template such that the thin film template remains available for at least one re-use. The method of manufacturing thin films according to this preferred embodiment can also include the additional step of attaching the thin films so produced to an electron microscopy sample grid. The releasing step preferably comprises exposing the release layer to a material that selectively attacks the release layer without substantially attacking the thin film layer. The release layer may be comprised of one or more materials that are deposited upon the template by vacuum deposition techniques. The thin film layer may bes comprised of one or more materials that are deposited upon the release layer by vacuum deposition techniques. This preferred methodology may be repeated using the same thin film template. Also described herein is a preferred thin film product made by these processes, including where the thin film further comprisesing an electron microscope sample grid attached to the thin film.

BRIEF DESCRIPTION OF THE SEVERAL VIEWS OF THE DRAWINGS

FIG. 2a shows plan view of a thin film template workpiece according to a step of the method of manufacturing a thin film template according to a preferred embodiment of the present invention.

FIG. 2b is a cross-sectional view of the thin film template workpiece taken along line 2b-2b of FIG. 2a according to another step of the method of manufacturing a thin film template according to a preferred embodiment of the present invention.

FIG. 3a shows plan view of a thin film template workpiece according to a step of the method of manufacturing a thin film template according to a preferred embodiment of the present invention.

FIG. 3b is a cross-sectional view of the thin film template workpiece taken along line 3b-3b of FIG. 3a according to another step of the method of manufacturing a thin film template according to a preferred embodiment of the present invention.

FIG. 6a shows plan view of the thin film template workpiece according to a step of the method of manufacturing a thin film template according to a preferred embodiment of the present invention.

FIG. 6b is a cross-sectional view of the thin film template workpiece taken along line 6b-6b of FIG. 6a according to another step of the method of manufacturing a thin film template according to a preferred embodiment of the present invention.

FIG. 7a shows plan view of a thin film template workpiece according to a step of the method of manufacturing a thin film template according to a preferred embodiment of the present invention.

FIG. 7b is a cross-sectional view of the thin film template workpiece taken along line 7b-7b of FIG. 7a according to another step of the method of manufacturing a thin film template having an isotropic undercut profile according to a preferred embodiment of the present invention.

FIG. 8b is a cross-sectional view of the novel thin film template having an isotropic undercut profile according to a preferred embodiment of the present invention taken along line 8b-8b of FIG. 8a.

FIG. 10b is a cross-sectional view of a novel thin film template having a re-entrant cross-sectional undercut profile according to a preferred embodiment of the present invention taken along line 10b-10b of FIG. 10a.

FIG. 11b is a cross-sectional view of a novel thin film template having a vertical cross-sectional undercut profile according to a preferred embodiment of the present invention taken along line 11b-11b of FIG. 11a.

FIG. 12a shows plan view of a novel thin film template according to a preferred embodiment of the present invention.

FIG. 12b is a cross-sectional view of a novel thin film template having a retrograde cross-sectional undercut profile according to a preferred embodiment of the present invention taken along line 12b-12b of FIG. 12a.

FIG. 13b is a cross-sectional view of a novel thin film template having a complex retrograde and re-entrant cross-sectional undercut profile according to a preferred embodiment of the present invention taken along line 13b-13b of FIG. 13a.

FIG. 14a shows plan view of a novel thin film template according to a preferred embodiment of the present invention.

FIG. 14b is a cross-sectional view of a novel thin film template having a complex retrograde and re-entrant cross-sectional undercut profile according to a preferred embodiment of the present invention taken along line 14b-14b of FIG. 14a.

DETAILED DESCRIPTION OF THE INVENTION

Figure 1A:
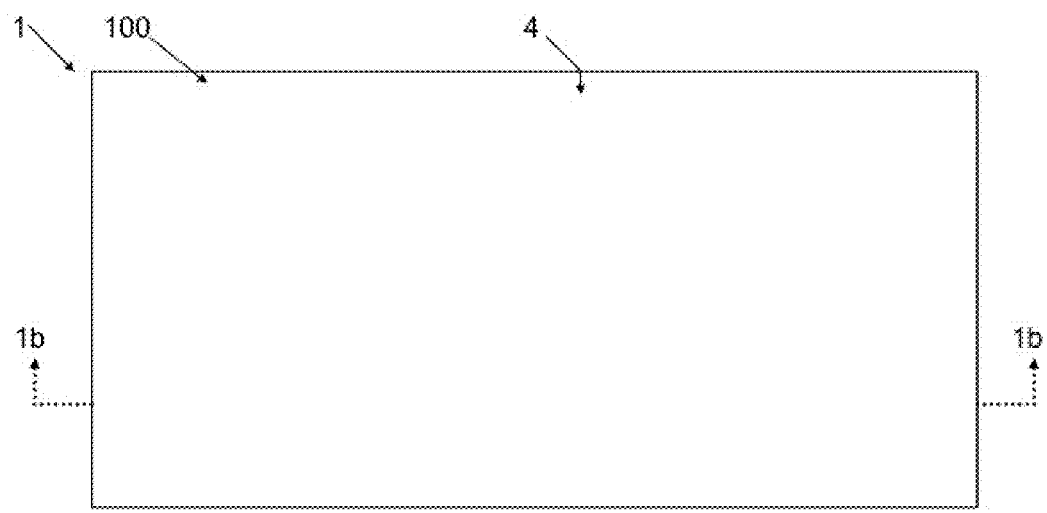
FIG. 1a shows plan view of a thin film template workpiece according to a step of the method of manufacturing a thin film template according to a preferred embodiment of the present invention.
Figure 1B:
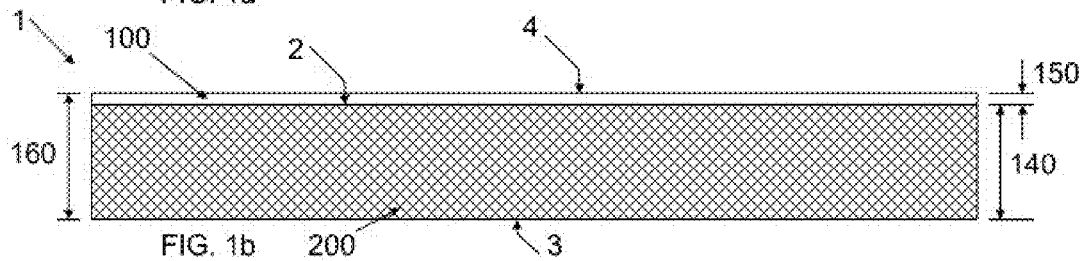
FIG. 1b is a cross-sectional view of the thin film template workpiece taken along line 1b-1b of FIG. 1a according to a step of the method of manufacturing a thin film template according to a preferred embodiment of the present invention.

Referring to FIG. 1a, there is shown a plan view of a novel thin film template workpiece 1 created according to a preferred embodiment of the present invention. FIG. 1b is a cross-sectional view of the workpiece 1 taken along lines 1b-1b of FIG. 1a. The workpiece can be of any desired size and shape, but is shown here in a substantially rectangular shape. In a preferred embodiment, the template workpiece 1 initially comprises a substrate material 200 and a surface material 100, it being a generally preferred strategy to have the substrate and surface materials ultimately formed into an end product template according to the preferred teachings of the present invention. As such, the term "workpiece" as used herein is intended to generally refer to the collection of materials or layers (e.g., substrate material 200, surface material 100, and other layers that may be employed, such as a photoresist layer 300 (FIG. 2), photomask layer 400 (FIG. 4), and the like, that are used in the creation of the template). The substrate material 200 has a thickness 140, and a top surface 2. The substrate material could comprise one material, such as for example, silicon, or a combination of layers of materials of choice (whether homogeneous, composite, multilayered, etc.). In one preferred embodiment, the substrate material 200 can be silicon having a crystalline orientation of (100), for example, a 4-inch silicon (100) wafer. It will be understood and appreciated that other starting materials, such as crystalline structures with different crystalline orientations, wafer pieces, non-crystalline materials, and substrates of different sizes and shapes can be employed to advantage practicing the teachings of this invention.

Taking this substrate 200, there is then deposited (or grown, or otherwise coated or placed) onto its surface (preferably only on the top surface 2, a surface material 100, having a thickness 120, for example, a 200 nm thick low-stress silicon nitride. The surface material 100 has a surface layer 4. The workpiece at this stage now has a total thickness 160 equal to the combined thickness of the substrate 200 and surface 100 layers. Preferably, the total thickness 160 of the workpiece 1 is sufficient to permit handling, or alternatively, to permit bonding of the workpiece 1 onto a suitable handle (not shown). It will also be appreciated and known to those of ordinary skill in the art that that other surface materials, combinations of surface materials (whether homogeneous, composite, multilayered, etc.), thicknesses and shapes are possible and that the surface material as part of the manufacturing process or as a matter of convenience may be deposited (or grown, or otherwise coated or placed) on both the top surface 2 and bottom surface 3 of the substrate 200. It is also a possibility that material compositions may exist that already have a multilayered structure that could be employed as the substrate, surface, and/or as a combination substrate/surface material.

FIG. 2a shows plan view of a thin film template workpiece according to a step of the method of manufacturing a thin film template according to a preferred embodiment of the present invention. FIG. 2b is a cross-sectional view of the thin film template workpiece taken along line 2b-2b of FIG. 2a according to another step of the method of manufacturing a thin film template according to a preferred embodiment of the present invention. Referring now to FIGS. 2a and 2b, once the desired substrate and surface material template workpiece 1 is assembled, a next preferred step is to apply a light-sensitive material, or photoresist layer 300, having a desired thickness 180 onto the surface 4 of the surface material 100. The use of photoresist layers is known in the art of photolithography, and the thickness 180 of the photoresist layer 300 will vary depending on the patterns that are to be created. In a preferred embodiment, the photoresist layer 300 can be applied in many different ways, such as the preferred spin coating techniques known in the art. Spray, dip and other techniques of applying the photoresist layer are known in the art, including, the further steps of oven baking or other heat treatment (such as hot plate) of the applied photoresist layer.

FIG. 3a shows plan view of a thin film template workpiece according to a step of the method of manufacturing a thin film template according to a preferred embodiment of the present invention. FIG. 3b is a cross-sectional view of the thin film template workpiece taken along line 3b-3b of FIG. 3a according to another step of the method of manufacturing a thin film template according to a preferred embodiment of the present invention. Referring to FIGS. 3a and 3b, as a next preferred step, a photomask 400, such as, e.g., a contact photolithographic mask having a surface 6, is placed into contact with the photoresist 300. The photomask 400 is created to contain the desired array of patterns or features 500 (e.g., an array of circular features) which are to be transferred onto the template workpiece 1. The patterns 500 on the photomask 400 can be of any desired configuration, including configurations that will facilitate programming of the instrumentation (e.g., equipment used in the manufacture of the template and/or equipment that will employ the thin films made from these templates). The creation of a photomask 400 is well known in the art. The outer boundary of these patterns may sometimes be referred to herein as an aperture, an opening and/or an aperture perimeter boundary. As will be appreciated in the art, the aperture or pattern shapes can be any desired shapes, sizes and dimmensions. Certain shapes may be better suited for certain thin film applications. For example, shapes that would be of interest in this technique would include those suitable for microfabrication (i.e. features less than about 1 mm and pitches generally less than 1 mm also). In terms of shapes, patterns comprised of conics, squares, hexagonal arrays, etc. can all be of value in, e.g., the cryoTEM community.

In a preferred embodiment, the photomask 400 is designed to have an array of 2 μm diameter 510 transparent circular features 500 on a 4 μm pitch 530, 540 (as measured from the center 520 of adjacent circular features 500). As can be seen, the features 500 in the photomask 400 define the footprint 310 or area of the photoresist 300 to be removed in subsequent steps. The area of the footptint 310 exposed through each feature 500 will be available for, e.g., selective irradiation with, e.g., UV light or other radiation source. In one embodiment, the features 500 are holes cut out of the photomask 400. In another embodiment, the features 500 are non-opaque (transparent) regions in an otherwise opaque photomask 400 such that the non-opaque (transparent) regions remain vulnerable to UV or other radiation techniques. As can be appreciated, the opaqueness regions 310 of the photomask can be created in numerous ways known in the art. In an alternative preferred embodiment, projection or other non-contact lithography techniques as well as e-beam lithography, dip-pin lithography, nano-imprinting techniques or other pattern transfer techniques well known in the art could be used to advantage to transfer the pattern of the photomask 400 or other pattern master into the photoresist layer 300 of the template workpiece 1. Non-contact lithography techniques are often employed where the topography of the workpiece 1 is irregular, or where contact could damage the substrate layer 200.

Additionally, there are many different techniques known in the art or that will become known in the art for transferring of a pattern. One well known general technique (with many variants) includes, for example and without limitation, photolithography (employing the combination of a photo definable polymer (i.e., a photoresist) and a physical photomask technique. Another pattern transfer technique could include, e.g., block copolymers are a class of polymers that are *self-ordering* and that can be used as a pattern master to create the pattern in the surface layer, etc. (i.e., the block copolymer serves the dual roles of photoresist and photomask). E-beam lithography and dip-pen lithography are examples of *maskless lithography* whereby a pattern is created directly in a photoresist layer without a photomask. Nano-imprinting is a technique used to *mechanically stamp* a master pattern (i.e., photomask in the form of a stamp) into a polymer layer. All of these techniques could be used quiet readily to create the pattern in the template of the present invention, it being the intent that any such transfer technique known or later discovered could be employed to advantage with the present invention.

Figure 4A:
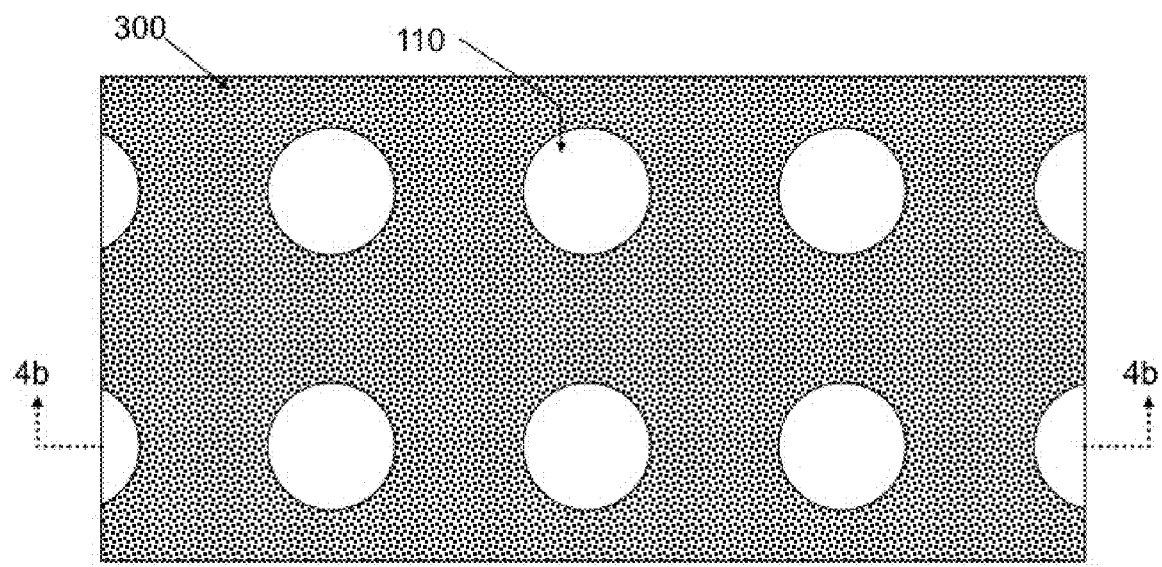
FIG. 4a shows plan view of the thin film template workpiece taken according to a step of the method of manufacturing a thin film template according to a preferred embodiment of the present invention.
Figure 4B:
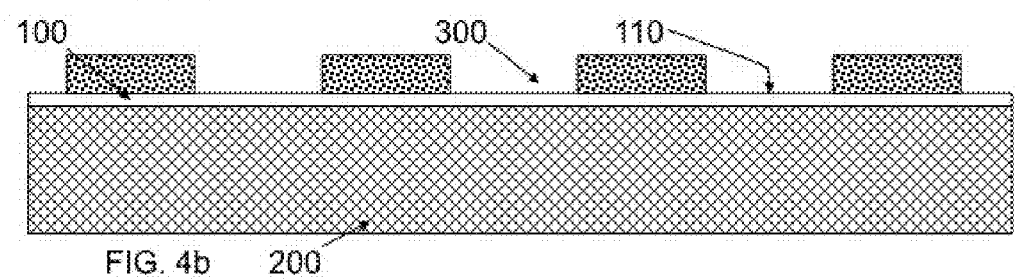
FIG. 4b is a cross-sectional view the thin film template workpiece taken along line 4b-4b of FIG. 4a according to another step of the method of manufacturing a thin film template according to a preferred embodiment of the present invention.

FIG. 4a shows plan view of the thin film template workpiece taken according to a step of the method of manufacturing a thin film template according to a preferred embodiment of the present invention. FIG. 4b is a cross-sectional view the thin film template workpiece taken along line 4b-4b of FIG. 4a according to another step of the method of manufacturing a thin film template according to a preferred embodiment of the present invention. The masked, photoresist layer of the workpiece 1 is now subjected to UV light of an appropriate wavelength (or other suitable radiation) to transfer the pattern of the photomask 400 into the photoresist layer 300. Next, the pattern in the photoresist layer 300 is developed using standard photolithographic development techniques. As a result, the photoresist layer 300 is now developed or patterned so that the surface material 100 is exposed in areas 110 where it is desired to remove the surface material 100. Preferably, but not required, the photomask 400 is now removed.

Figure 5A:
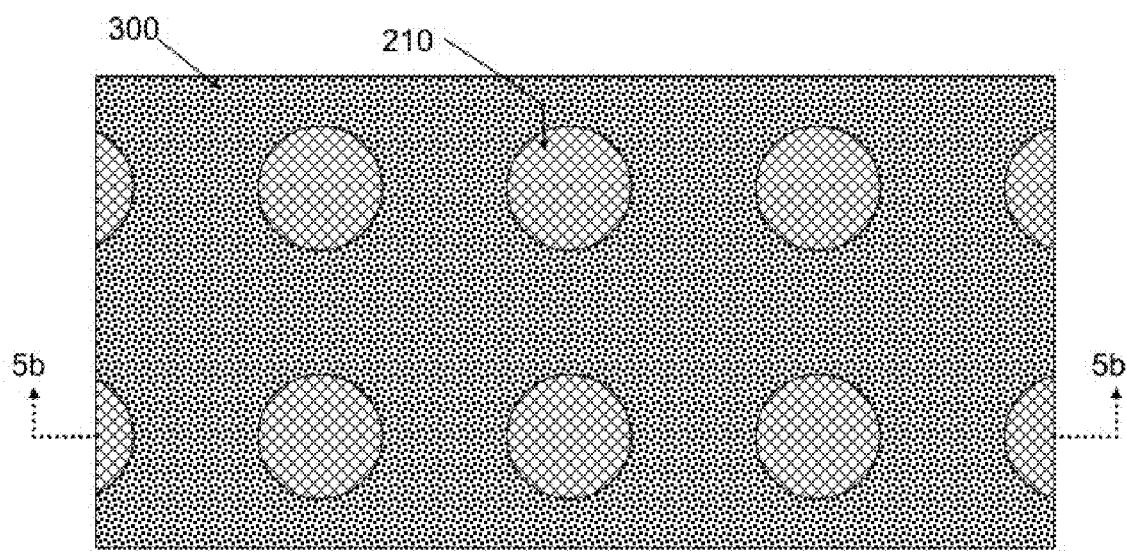
FIG. 5a shows plan view of a thin film template workpiece according to a step of the method of manufacturing a thin film template according to a preferred embodiment of the present invention.
Figure 5B:
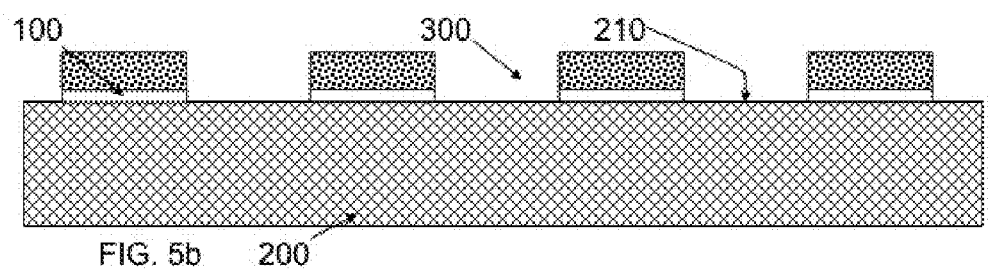
FIG. 5b is a cross-sectional view of the thin film template workpiece taken along line 5b-5b of FIG. 5a according to another step of the method of manufacturing a thin film template according to a preferred embodiment of the present invention.

Once the features 500 of FIGS. 3*a* and 3*b* have been transferred through the photoresist layer 300, with respect to FIGS. 4*a* and 4*b* the desired areas 110 of the surface layer 100 can be further processed (removed) with, e.g., an etching of desired selectivity. The selection of an etching(s) may depend on whether one desires to etch through the surface layer 100 in the desired areas 110 without substantially effecting the integrity of the subsurface material 200 below such areas 110, or whether one desires to etch through the surface layer 100 in the desired areas 110 and into a portion of the subsurface material 200 below such areas 110. Referring now to FIG. 5*a*, there is shown a plan view of a thin film template workpiece 1 according to a step of the method of manufacturing a thin film template according to a preferred embodiment of the present invention. FIG. 5*b* is a cross-sectional view of the thin film template workpiece 1 taken along line 5*b*-5*b* of FIG. 5*a* according to another step of the method of manufacturing a thin film template according to a preferred embodiment of the present invention. As a result, the surface layer area 110 is now developed or patterned so that the substrate material 200 is exposed in areas 210 where it is desired to remove the substrate material 200.

FIG. 6*a* shows plan view of the thin film template workpiece 1 according to a step of the method of manufacturing a thin film template according to a preferred embodiment of the present invention. FIG. 6*b* is a cross-sectional view of the thin film template workpiece 1 taken along line 6*b*-6*b* of FIG. 6*a* according to another step of the method of manufacturing a thin film template according to a preferred embodiment of the present invention. Referring to FIGS. 5*a*, 5*b*, 6*a* and 6*b* there are illustrated two preferred techniques for transferring the pattern into the surface layer 100. For example, based on the composition of the surface material 100 and/or the subsurface material 200, the transfer of the pattern 500 may be focused solely on the surface layer 100 (FIG. 5*b*), so that the etching used for the surface layer 100 does not materially effect the subsurface material 200. For example, where the surface layer 100 is silicon dioxide and the substrate layer 200 is silicon, then the use of Hydrofluoric Acid will be selectively specific in etching away the surface silicon dioxide without materially effecting the silicon substrate layer. In another embodiment, the transfer of the pattern 500 within the aperture boundaries may be directed to both the surface layer 100 and the subsurface layer 200 in areas 220 such that the pattern is transferred into the substrate layer 200 to a desired depth 230. Additionally, it is possible, if desired, that portions of the workpiece 1 be treated or processed (e.g., etched) differently than other portions of the workpiece, so that, e.g., one layer may be etched differently than another layer, or, e.g., certain features 500 may be processed differently from other features 500 on the same workpiece 1.

For example, in a preferred embodiment, referring to FIGS. 6*a* and 6*b*, the transfer of the pattern from the photoresist layer into the surface material can be achieved with a Reactive Ion Etch ("RIE") of a silicon nitride surface layer 100. However, in this embodiment, the etching can also preferably etch into a silicon substrate layer 200 to a desired cavity depth 230. The depth of the cavity created can vary, but could be on the order of 100 nm in the case of a silicon wafer as noted above. Although the etch profile indicated in the areas 220 of the substrate layer 200 are depicted as being generally cylindrical in nature, depending on the substrate material (and its, e.g., crystalline or other structure, etc.) and the etchings used, the resulting etch profile (or cavity) geometry could vary. Referring again to FIGS. 5*a* and 5*b*, the etching can be chosen to be highly selective to the surface material 100 and less or not selective to the substrate material 200. As will be apparent in view of the teachings of this invention, the substrate material(s) 200 and surface material (s) 100 and various etchings, etc. can be selected with a view towards optimizing the relative selectivity of the various etchings to the surface and substrate layers to create preferred templates employing various undercut structures.

Figure 9A:
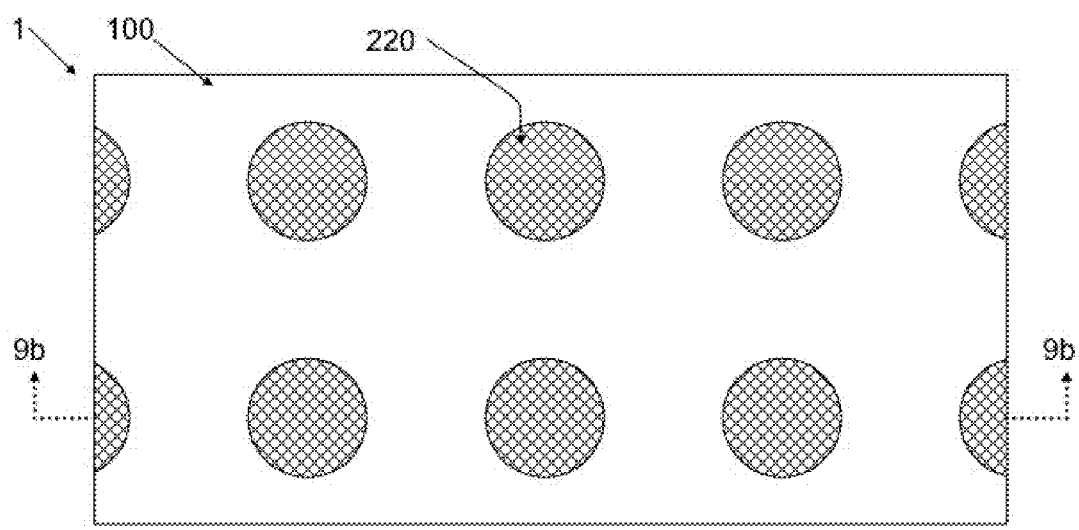
FIG. 9a shows plan view of a thin film template workpiece according to a step of the method of manufacturing a thin film template according to a preferred embodiment of the present invention.
Figure 9B:
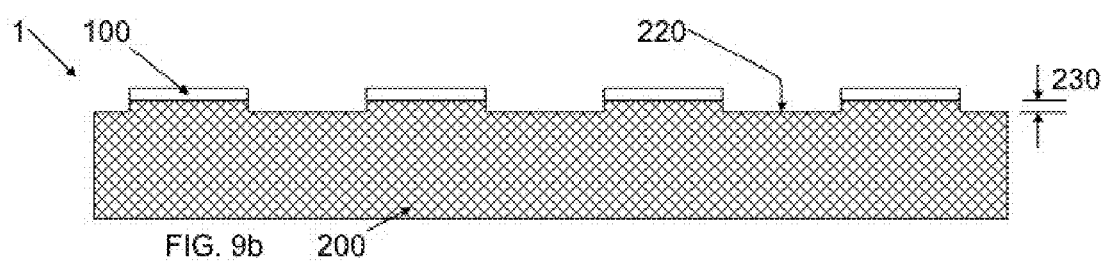
FIG. 9b is a cross-sectional view of the thin film template workpiece taken along line 9b-9b of FIG. 9a according to another step of the method of manufacturing a thin film template according to a preferred embodiment of the present invention.

Referring now to FIG. 9*a* there is shown a plan view of a thin film template workpiece 1 according to a step of the method of manufacturing a thin film template according to a preferred embodiment of the present invention. FIG. 9*b* shows a cross-sectional view of the thin film template workpiece 1 taken along line 9*b*-9*b* of FIG. 9*a* according to another step of the method of manufacturing a thin film template according to a preferred embodiment of the present invention. In a preferred embodiment, the photoresist layer 300 is stripped away or otherwise removed (although in an alternate embodiment, it is not necessary to strip the photoresist layer) prior to further processing of the exposed areas 220 of the substrate 200. The surface of the workpiece 1 can then preferably be dipped in concentrated Hydrofluoric Acid (or other suitable substance) to remove any native oxide that may have formed on the exposed surface 220 of the silicon (or other material) substrate layer 200.

Referring still to FIG. 9, a silicon subsurface layer 100 can preferably be further exposed to a potassium hydroxide (KOH) etch at 60° C. for 1 minute, followed by a deionized water (Di $H_2O$) rinse, followed by a methanol soak and then finally air dried. The result of such etch is the final template. Creation of a preferred undercut structure or profile 950 beneath the surface material layer 100 can be accomplished in numerous final template configurations such as those illustrated in, e.g., the exemplary FIGS. 8, and 10-14. The varying undercut structure or profile 950 configurations can be influenced by the selected substrate material(s) and the etchant(s) used. Moreover, it will be understood and appreciated that other etchant temperatures, etch times, and chemicals for both soaking and rinsing the workpiece can be employed to advantage practicing the teachings of this invention.

For example, FIG. 7*a* shows plan view of a thin film template workpiece according to a step of the method of manufacturing a thin film template according to a preferred embodiment of the present invention. FIG. 7*b* is a cross-sectional view of the thin film template workpiece taken along line 7*b*-7*b* of FIG. 7*a* according to another step of the method of manufacturing a thin film template having an isotropic undercut profile 950 according to a preferred embodiment of the present invention. To accomplish this isotropic undercut profile, the workpiece 1 such as illustrated in FIG. 6*b* is subjected to, e.g., one or more etching procedure(s) such as the example described above in conjunction with the workpiece shown in FIG. 9. As noted earlier, the etching step(s) can proceed with or without the presence of the photoresist layer 300. During this etching process, the etchant is selected to be selective to the exposed substrate material layer 220, but not the surface material layer 100. However, one could select an etchant that etches both layers (100, 200) so that the earlier step of etching the surface layer is integrated into the step of later etching the substrate layer 200. It was found that during this etching step, it was possible to etch away substrate material 200 from directly underneath the surface material layer 100 proximate the radius 510 of the surface feature(s) or pattern(s) 500 to create a cavity having an undercut profile, or lip, or zone of discontinuity 950 between the surface layer 100 and the substrate layer 200 that has advantageous properties when the template is later used to create thin films. The advantages of the undercut 950 include the ability to easily remove the thin film layer (not shown) from the surface layer 100, or in the case of FIG. 14b, the subsurface layer 200 without damaging or requiring the destruction or sacrificing of the template.

Referring again to FIGS. 7a and 7b, there is illustrated one possible embodiment of an isotropic etch technique resulting in a substantially isotropic, or hemispherical cross-sectional profile 290 in the substrate material 200. In a preferred embodiment, the undercut or region of discontinuity 950 has a width 250 sufficient to create a discontinuity between the surface material layer 100 and the subsurface material layer 200. Typically, this width 250 will be greater than zero (except as illustrated in connection with FIG. 14). As will be seen, the pattern is transferred into the substrate 200 to a desired depth 240 and a new radial diameter 265 is created. Although the general shape of the etched pattern 290 is illustrated here as a substantially hemispherical cavity shape, it is understood that many different shapes can result (based on, e.g., the substrate material and the etchants used) while still creating an advantageous undercut 950. Various shapes (or variants thereof) of the patterned area (cavity) of the substrate layer 200 could include, without limitation, hexagonal, octagonal, nonagonal, decagonal, geodesic, hemispherical substantially spherical, cubic, square, rectangular, pyramidal, conical, frusto-conical, and any other shape that may follow the lattice (crystalline or otherwise) structure of the substrate layer(s) 200.

In a preferred embodiment, the surface layer has a topside and an underside, the surface layer underside being in contact with the subsurface layer. The surface layer contains one or more apertures and the subsurface layer contains one or more cavities, these cavities having a region of discontinuity between themselves and the surface layer apertures or aperture perimeter boundaries. The region of discontinuity preferably comprises an undercut. The undercut can comprise a region of the cavity walls proximate the aperture perimeter boundary where such walls have a substantially retrograde slope. The undercut can also comprise a region of the surface layer forming a lip at the aperture perimeter boundary, the lip comprising a topside face, an underside face substantially underneath the topside face, and a depth, the underside face having an outer boundary, and an inner boundary. The lip underside face has a length defined as the distance between the outer and inner boundaries, the lip underside face inner boundary contacting the cavity substrate layer. The lip underside face inner boundary preferably contacts said cavity substrate layer in a region where said cavity walls have a substantially retrograde slope. The lip underside face inner boundary also can contact the cavity substrate layer in a region where the cavity walls have a substantially re-entrant slope.

Figure 8A:
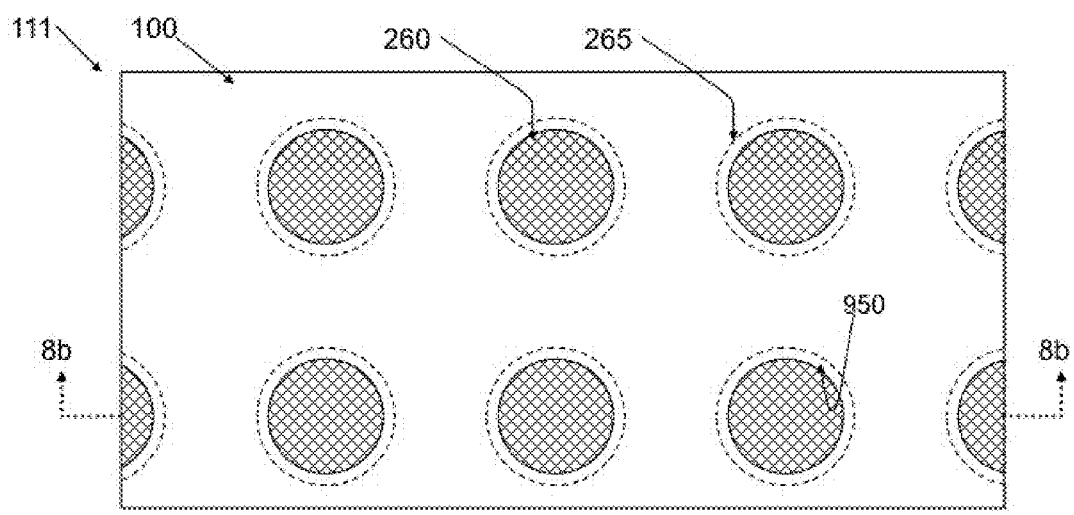
FIG. 8a shows plan view of a novel thin film template according to a preferred embodiment of the present invention.
Figure 8B:
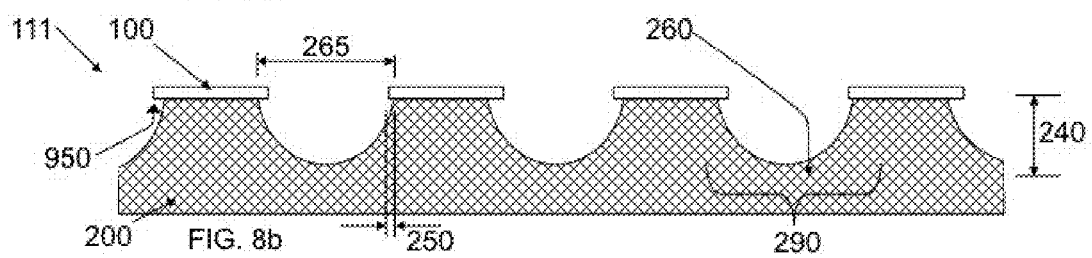

Referring now to FIG. 8a, there is depicted a plan view of a novel thin film template 111 made according to a preferred embodiment of the present invention. FIG. 8b is a cross-sectional view of the novel thin film template 111 having an isotropic undercut profile according to a preferred embodiment of the present invention taken along line 8b-8b of FIG. 8a. This figure illustrates the result of the etching processes described in connection with FIGS. 7a and 7b, except that in FIGS. 8a and 8b, the photoresist layer 300 has now been removed. In this form, this preferred thin film template 111 is now ready for use, and reuse, in the creation of thin films (discussed later herein).

Figure 10A:
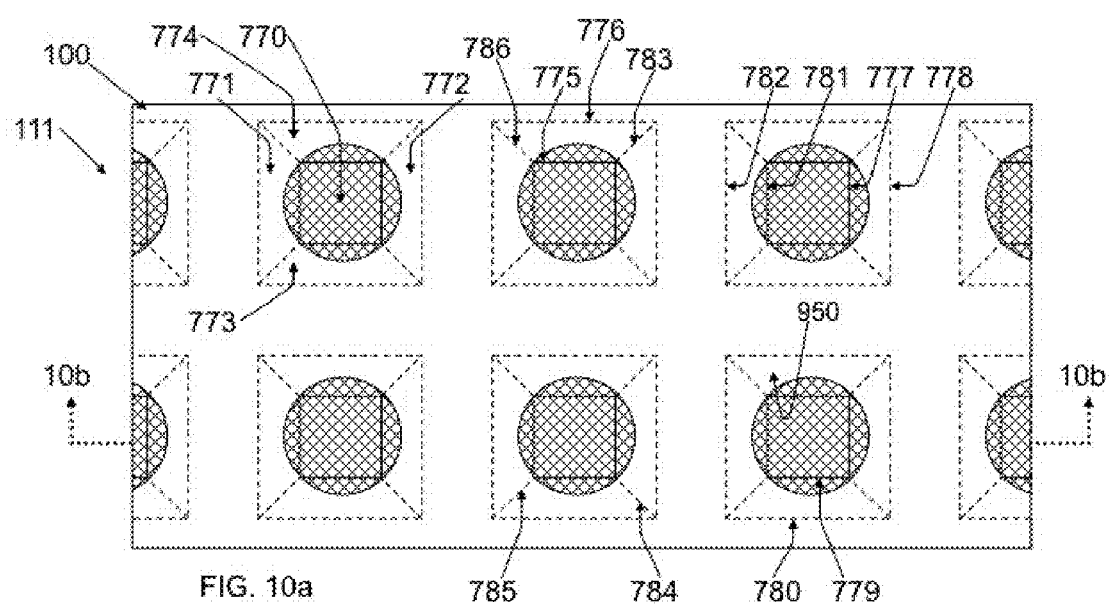
FIG. 10a shows plan view of a novel thin film template according to a preferred embodiment of the present invention.
Figure 10B:
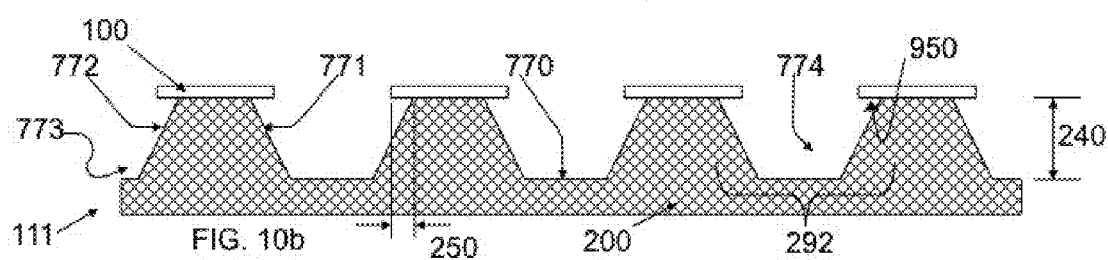

Similarly, FIG. 10a shows a plan view of a novel thin film template 111 according to a preferred embodiment of the present invention. FIG. 10b is a cross-sectional view of a novel thin film template 111 having a re-entrant cross-sectional undercut profile according to a preferred embodiment of the present invention taken along line 10b-10b of FIG. 10a. In this particular embodiment, the result of the etching procedures creates an anisotropic cross-sectional profile 292 in the substrate material 200 in the patterned areas having a desired depth 240. Although the general shape of the etched pattern 292 is illustrated here as an anisotropic shape, (here, essentially an inverted, flat-topped pyramidal shape) it is understood that many different shapes of varying degrees of geometric or non-geometric complexity can result while still creating an advantageous undercut 950. In this embodiment, the etching procedure creates an array of anisotropic shapes having a first wall face 771 defined by a top edge 781, bottom edge 782, and opposed side edges 785, 786; a second wall face 774 adjacent the first, defined by a top edge 775, bottom edge 776, and opposed side edges 786, 783; a third wall face 772 opposite the first and adjacent the second, defined by a top edge 777, bottom edge 778, and opposed side edges 783, 784; a fourth wall face 773 opposite the second and adjacent the first, defined by a top edge 779, bottom edge 780, and opposed side edges 784, 785; and a base 770. The resulting undercut 950 has a desired width 250.

Figure 11A:
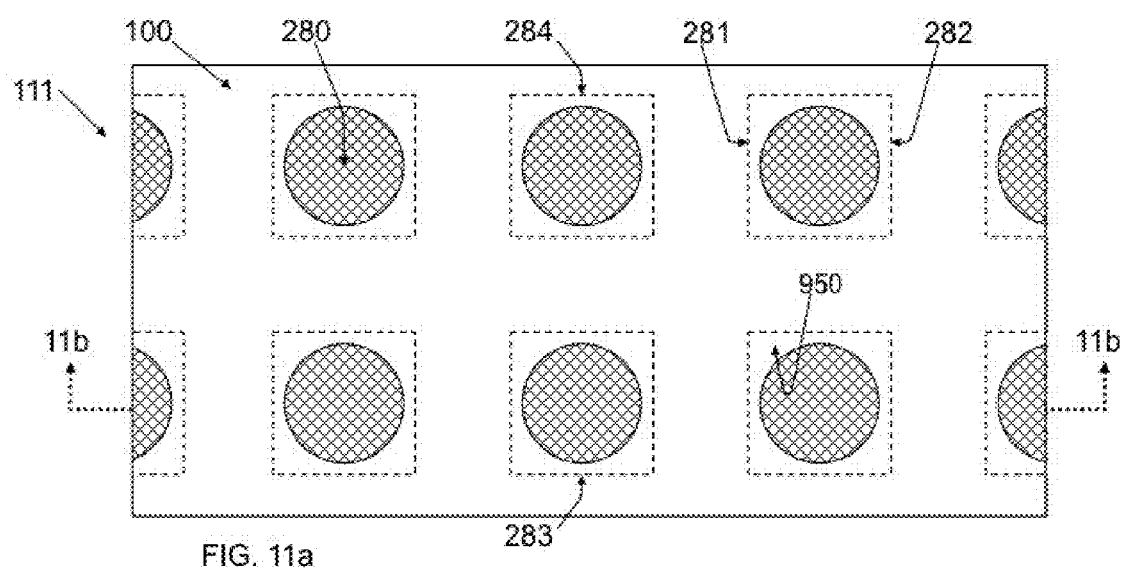
FIG. 11a shows plan view of a novel thin film template according to a preferred embodiment of the present invention.
Figure 11B:
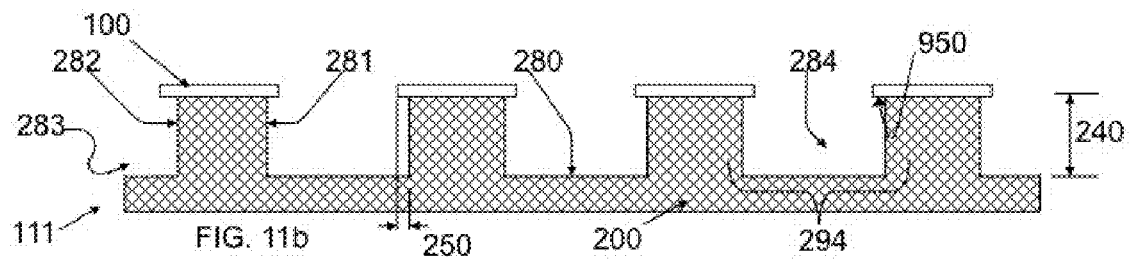

FIG. 11a shows plan view of a novel thin film template 111 according to a preferred embodiment of the present invention. FIG. 11b is a cross-sectional view of a novel thin film template 111 having a vertical cross-sectional undercut profile 950 according to a preferred embodiment of the present invention taken along line 11b-11b of FIG. 11a. In this particular embodiment, the result of the etching procedures creates an anisotropic cross-sectional profile 294 in the substrate material 200 to a depth 240 in the patterned areas. As will be seen, the undercut or lip 950 has a width 250. Although the general shape of the etched pattern 292 is illustrated here as an anisotropic shape, (here, essentially an inverted, flat-topped pyramidal shape) it is understood that many different shapes of varying degrees of geometric or non-geometric complexity can result while still creating an advantageous undercut 950. In this embodiment, the etching procedure creates an array of anisotropic shapes, substantially cubic shapes essentially defined by four substantially vertical walls 281, 282, 283, 284 and a base 280.

FIG. 12a shows plan view of yet another novel thin film template 111 according to a preferred embodiment of the present invention. FIG. 12b is a cross-sectional view of a novel thin film template 111 having a retrograde cross-sectional undercut profile 296 according to a preferred embodiment of the present invention taken along line 12b-12b of FIG. 12a. This embodiment achieves a pattern in the substrate that is somewhat of an inverted shape when compared to the shape in FIGS. 10a and 10b. In this embodiment, the etching procedure creates an array of anisotropic shapes having a first retrograde wall face 622 defined by a top edge 606, bottom edge 608, and opposed side edges 632, 630; a second retrograde wall face 624 adjacent the first, defined by a top edge 602, bottom edge 604, and opposed side edges 632, 626; a third retrograde wall face 618 opposite the first and adjacent the second, defined by a top edge 610, bottom edge 612, and opposed side edges 626, 628; a fourth retrograde wall face 620 opposite the second and adjacent the first, defined by a top edge 614, bottom edge 616, and opposed side edges 628, 630; and a base 600. The resulting undercut 950 has a desired width 250. Additionally, FIG. 12b illustrates that a retrograde wall face will create a zone of additional if no independent, discontinuity owing to its retrograde slope occurring over the retrograde distance 250a. The zone of discontinuity is created by either the undercut region 295 and/or by the retrograde slope of the wall faces 622, 624, 618 and/or 620. It is preferred that the area of discontinuity around the openings, or apertures in the surface layer created by the patterning 500 of the surface layer be as great as possible, however, so long as some area of discontinuity is created around these apertures, the benefits of the invention can be enjoyed.

Figure 13A:
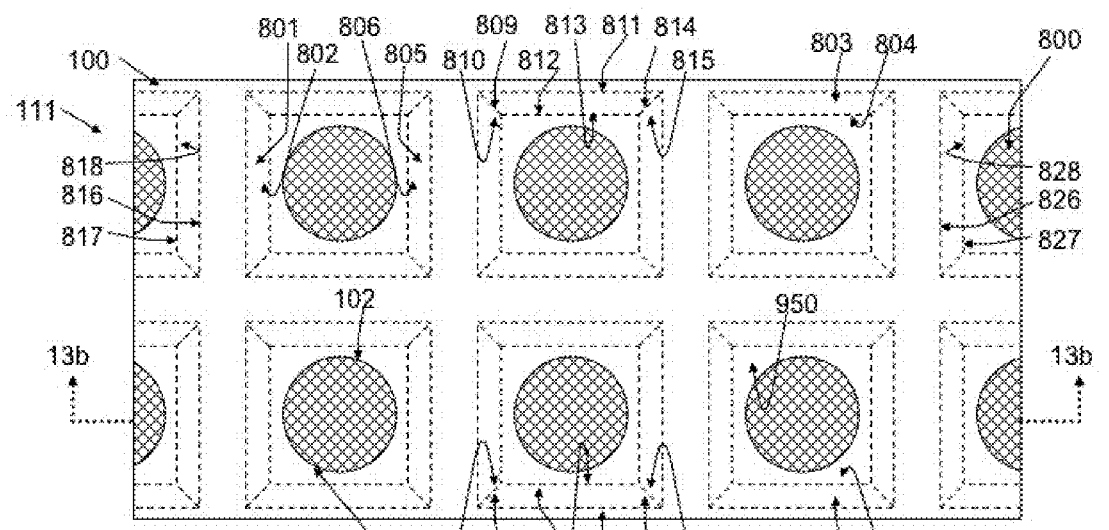
FIG. 13a shows plan view of a novel thin film template according to a preferred embodiment of the present invention.
Figure 13B:
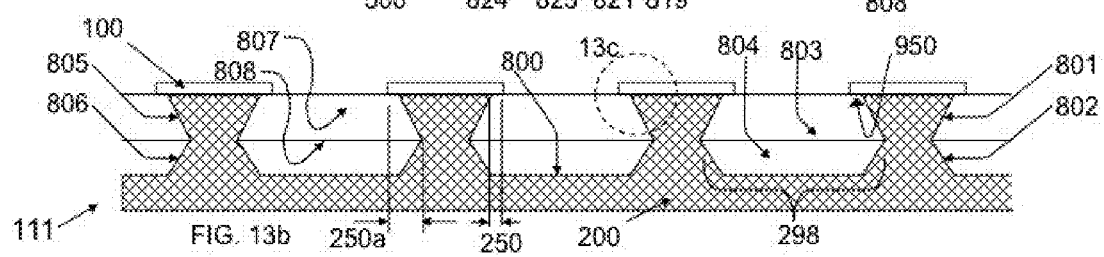

FIG. 13a shows plan view of a novel thin film template 111 according to a preferred embodiment of the present invention. FIG. 13b is a cross-sectional view of a novel thin film template 111 having a complex retrograde and re-entrant cross-sectional undercut profile according to a preferred embodiment of the present invention taken along line 13b-13b of FIG. 13a. FIG. 14a shows plan view of a novel thin film template 111 according to a preferred embodiment of the present invention. FIG. 14b is a cross-sectional view of a novel thin film template 111 having a complex retrograde and re-entrant cross-sectional undercut profile according to a preferred embodiment of the present invention taken along line 14b-14b of FIG. 14a. Referring now to FIGS. 13a, 13b, 14a, and 14b, there are disclosed preferred thin film templates 111 having similar features, the primary differences being that a surface layer 100 was not employed in the final template structure (111, FIG. 14b), such surface layer either being absent the entire manufacturing process, or removed during the manufacturing process. In the embodiment shown in FIG. 14b, the undercut 950 is not actually an undercut going under the surface layer 100 because in this embodiment, the substrate layer 200 was the final remaining layer, the "undercut" 950 here being represented by the inversely declining (or retrograde) wall faces 801, 803, 805, 807 that create a discontinuity at their respective upper edges 827, 812, 817, 822.

Referring still to FIGS. 13 and 14, each patterned area 210 in the substrate layer 200 has somewhat of a geodesic ball shape, here with an upper, quasi-hemispherical section of the patterned area within the substrate material 200 being defined by the retrograde wall faces 801, 803, 805, 807, while a substantially mirror-image, lower, quasi-hemispherical section of the patterned area within the substrate material 200 being defined by the respective adjoining re-entrant wall faces 802, 804, 806, 808, the upper quasi-hemispherical section being similar to the profile described in connection with FIG. 12.

For example, the upper quasi-hemispherical section of the patterned substrate is defined by a first upper retrograde wall face 801 defined by a top edge 827, bottom edge 826, and opposed side edges 809, 824; a second upper retrograde wall face 803 adjacent the first, defined by a top edge 812, bottom edge 811, and opposed side edges 809, 814; a third upper retrograde wall face 805 opposite the first and adjacent the second, defined by a top edge 817, bottom edge 816, and opposed side edges 814, 819; and a fourth upper retrograde wall face 807 opposite the second and adjacent the first, defined by a top edge 822, bottom edge 821, and opposed side edges 819, 824; and a base 600. The resulting undercut 950 has a desired width 250. First upper retrograde wall face 801 shares the same side edge 809 with second upper retrograde wall face 803. First upper retrograde wall face 801 shares its other side edge 824 with fourth upper retrograde wall face 807. Second upper retrograde wall face 803 shares its other side edge 814 with third upper retrograde wall face 805. Third upper retrograde wall face 805 shares its other side edge 819 with fourth upper retrograde wall face 807.

Similarly, the lower quasi-hemispherical section of the patterned substrate is defined by a first lower re-entrant wall face 802 sharing as its top edge 826 the bottom edge 826 of first upper retrograde wall face 801, bottom edge 828, and opposed side edges 810, 825; a second lower re-entrant wall face 804 adjacent the first, sharing as its top edge 811 the bottom edge 811 of the second upper retrograde wall face 803, a bottom edge 813 and opposed side edges 810, 815; a third lower re-entrant wall face 806 sharing as its top edge 816 the bottom edge 816 of third upper retrograde wall face 805, bottom edge 818, and opposed side edges 815, 820; and a fourth lower re-entrant wall face 808 sharing as its top edge 821 the bottom edge 821 of fourth upper retrograde wall face 807, bottom edge 823, and opposed side edges 825, 820; and a base 800. The resulting undercut 950 has a desired width 250. First lower re-entrant wall face 802 shares the same side edge 810 with second lower re-entrant wall face 804. First lower re-entrant wall face 802 shares its other side edge 825 with fourth lower re-entrant wall face 808. Second lower re-entrant wall face 804 shares its other side edge 815 with third lower re-entrant wall face 806. Third lower re-entrant wall face 806 shares its other side edge 820 with fourth lower re-entrant wall face 808.

As will be appreciated from the teachings herein, the angles of the sidewalls formed in the patterned subsurface area 210 below the surface layer 100 can range from retrograde to fully vertical to re-entrant. In the case of the template 111 not employing a surface layer (such as illustrated and described in conjunction with FIG. 14) it is preferred that the sidewalls of the patterned areas that intersect with the surface of the substrate layer 200 be of the retrograde variety.

The substrate material is not limited to a single material but could be an ensemble, composite, or amorphous group of one or more materials. Thus, the particular material of the template in which the undercut profile is formed beneath each surface feature in the surface material can occur in any layer or combination of layers of the substrate material. The use of multiple layers exhibiting an undercut profile could be used as a means to provide multiple release layers in a stack. Such an approach could thereby extend the lifetime of the template by allowing the surface material to be stripped revealing a "fresh" (and possibly different) surface material. The process of forming the undercut profile beneath each surface feature is not limited to dry etching of the substrate material, but may also be accomplished by exploiting the relative etch rates of the surface and substrate materials with either isotropic or anisotropic wet etching chemistries or by any combination of wet and dry etch chemistries. The relative etch rates that are exploited to create the undercut profile can be engineered as part of the template by means of using distinct materials for the surface material and substrate material (e.g., silicon for the substrate material and silicon nitride for the surface material) and/or using similar materials but with compositional differences between the surface material and substrate material (e.g., undoped/intrinsic silicon for the substrate material and heavily doped n-type silicon for the surface material).

The point in the manufacturing process during which the undercut profile beneath each surface feature is formed is not limited to the etching of the substrate material. Rather, the template can be comprised of a single material such as silicon wherein a retrograde profile is formed under each surface feature simultaneously with the formation of the surface features in the silicon layer. This would lead to a template formed of a single material that functions simultaneously in the roles of the substrate material and the surface materials

EXAMPLE I

A preferred thin film template 111, as generally depicted in FIGS. 14a and 14b was created as follows in accordance with the teachings above. Referring again to the various Figures, in this preferred embodiment, the substrate material 200 used was silicon having a crystalline orientation of (100), in this case, a 4-inch silicon (100) wafer. Taking this substrate, there was then deposited (or grown, or otherwise coated or placed) onto its surface as a surface material 100 a 200 nm thick low-stress silicon nitride (FIGS. 1a and 1b). A light-sensitive material, or photoresist 300, onto the surface 4 of the surface material 100 (FIGS. 2a and 2b). In this embodiment, the photoresist 300 was spin coated, and then heat treated using a hot plate.

Next, a photomask 400 was placed into contact with the photoresist 300 for carrying out contact photolithographic techniques. The photomask 400 was created to contain the desired array of patterns which were to be transferred onto the template. In this preferred embodiment, the photomask 400 was designed to have an array of 2 μm diameter 510 transparent circular features 500 on a 4 μm pitch 530, 540 (as measured from the center 520 of adjacent circular features 500)(FIGS. 3a and 3b). As can be seen, the features 500 in the photomask 400 define the footprint 310 or area of the photoresist 300 to be removed in subsequent steps. The area of the footprint 310 exposed through each feature 500 will be available for, e.g., selective irradiation with, e.g., UV light or other radiation source.

Next, the masked photoresist layer of the workpiece was subjected to UV light of an appropriate wavelength to transfer the pattern of the photomask into the photoresist layer (FIG. 3). The pattern in the photoresist layer 300 was developed (FIG. 4) using standard photolithographic development techniques. As a result, the photoresist layer became patterned so that the surface material 100 is exposed in areas 110 where it is desired to remove the surface material. In this preferred embodiment, referring to FIGS. 6a and 6b, the transfer of the pattern from the photoresist layer 300 into the surface material 100 in areas 110 was achieved with a Reactive Ion Etch ("RIE") of the silicon nitride surface layer. In this embodiment, the RIE etchant also preferably etched into the silicon substrate layer 200 (FIG. 6).

Referring now to FIG. 9, in this preferred embodiment, the photoresist layer 300 was stripped. The surface of the workpiece 1 was then preferably dipped in concentrated Hydrofluoric Acid to remove any native oxide that may have formed on the exposed surface 220 of the silicon substrate layer 200. Referring still to FIG. 9, the subsurface layer 200 was further exposed to a potassium hydroxide (KOH) etch at 60° C. for 1 minute, followed by a deionized water (Di H2O) rinse, followed by a methanol soak and then finally air dried. The result of such etch was the final template structure generally depicted in FIG. 14. As shown in FIG. 14b, the KOH etched the substrate material preferentially to its crystalline lattice thereby resulting in creation of a zone of undercut 950 and angled sidewalls. The longer the etch time, the more of the crystalline lattice of the substrate can be etched away. As such, although FIG. 14 generally depicts some square angularity in the area patterned into the substrate layer, if the etching does not proceed as long, then the full extent of the square angularity of the structure may not be revealed, but instead, may present itself as more of a complex geodesic shape, yet still having the desired undercut 950 functionality.

In yet another preferred embodiment of the present invention, a separate substrate layer and a separate surface layer are respectively separately patterned with, e.g., lithographic techniques and desired patterns, followed by the steps of overlaying the patterned surface layer onto the patterned subsurface layer such that a preferred undercut profile is created at the inferface between the two layers.

By using the teachings contained herein, one can make novel reusable thin film templates. These thin film templates so made have a number of uses (and reuses) to make thin films of any type for any purpose. The template structure 111 provides a general purpose method to create thin-film replicas (in any material compatible with vacuum deposition techniques) of any pattern formed in the template. Among the many possible applications, the template structure disclosed herein can be used to make specimen support films for examination of specimens with electron microscopy (e.g. scanning electron microscope, transmission electron microscope, scanning tunneling electron microscope, etc.) and/or scanning probe microscopy (e.g., atomic force microscope). For example, the novel thin film templates 111 of the present invention are ideally suited for use as a template for the deposition and release of thin films. That is, the undercut profile 950 causes a discontinuity to exist in any thin film that is deposited upon the template structure 111. The discontinuity in the deposited film resulting from the undercut profile 950 in turn provides a mechanism for a solution to have access to dissolve a release layer that is deposited between the surface material 100 of the template 111 and a subsequently deposited thin film layer. The undercut profile 950 is therefore a key feature that allows the surface features to be replicated in the thin film.

For example, a sacrificial release layer is typically first deposited followed by a thin film, which both can be deposited onto the template 111 with standard vacuum evaporation equipment. The entire structure (template, release layer, and thin film layer) can then be immersed into a chemical that will preferentially remove the release layer without attacking or degrading the thin film or the template structure 111. Once the release layer is removed, the thin film layer will be separated from the template 111 and will float in the solution used to remove the release layer.

In one preferred embodiment of the present invention, the template can be used to create a thin film replica of the surface feature(s) by means of a release layer and a replica layer where the release layer is comprised of one or more materials deposited upon the template by vacuum deposition techniques, the replica layer is comprised of one or more materials deposited on top of the release layer by vacuum deposition techniques, the materials to form the release layer and the replica layer are any combination of materials that can be deposited by vacuum deposition techniques (e.g. carbon, gold, silver, beryllium, copper, nickel, aluminum, tungsten, etc.), the release layer and replica layer materials being chosen such that the process used to consume the release layer does not attack the replica layer. A purpose of a thin film replica is enable a thin film deposited on a surface and released from the surface to obtain topography similar to the surface. Thin films are often used as specimen supports, or structures, upon which specimens are placed prior to TEM (transmission electron microscopy) analysis. After placing the desired specimen on to the specimen support, both are placed in the microscope and the specimen is inspected/analyzed. Specimen supports are required since TEM specimens are often small and/or thin, and are therefore not self-supporting. Thin carbon films are a layer of carbon with nm-scale thickness often used as a specimen support during TEM analysis. Thin carbon, with or without holes, is a preferred specimen support.

Moreover, the template 111 can be reused for creating additional thin film replicas. Without the undercut zone 950 on each template of the present invention, an applied thin film could not be removed as there would be no feasible manner in which to apply a release chemical to the underlying release layer since the thin film encapsulates the release layer. With the undercut zone 950 of the present invention, when the release layer is applied to the surface layer 100 of the template 111 the release layer does not form a solid layer across the surface of the template 111 this being because the "holes" or features 500 in the template have an undercut zone 950 around their perimeter thereby creating a discontinuity in the release layer being applied.

As such, there are no "collars" formed from the surface down along the edges of the patterned features in the substrate layer. Similarly when the thin film layer is applied on top of the release layer, these same discontinuities (undercuts 950) prevent the thin film from forming a solid, encapsulating layer across the top surface 100 of the template 111 and down into each feature thereby sealing off the release layer. As such, rather than having to sacrifice all or part of the template structure itself to achieve release of the thin film from the template (as is done in the prior art), the present invention permits one to subject the thin film layer on the template to a chemical treatment (or water soluble treatment) that will preferentially attack only the release layer, and since this chemical treatment is able to contact the release layer, the thin film can be released from the template 111 without sacrificing the template structure. After the template has been used for creation of a thin film, it can be readied for reuse.

Further, the present invention is directed to the thin films that can be made from these novel thin film templates. As mentioned herein, the thin films produced by the novel template described herein could be employed in any number of applications requiring a thin film. For example, the thin film itself could be the desired specimen of study for use in electron microscopy, for calibration in EM, as a filtration media, as a surface to grow materials, as a diffraction grating, and as an antireflective coating, to name a few. Additionally, this invention is also directed to the thin films so created and mounted on an EM grid (e.g., copper mesh) for use as a specimen support grid for use in electron microscopy applications, e.g., cryo-TEM.

It should be noted that support grids comprised of a thin carbon film with a regular array of holes supported by a copper grid are commercially available for cryo-TEM. These carbon coated grids are supplied almost exclusively by Quantifoil Microtools, GmbH and are marketed under the name "Quantifoil". The template process of the present invention is novel over and superior to films fabricated using the prior art (see U.S. Pat. No. 6,645,744, U.S. Pat. No. 6,821,692, and Ermantraut et al., "Perforated support foils with pre-defined hole size, shape and arrangement," Ultramicroscopy 74 (1998), pp 75-81) in a number of ways.

Figure 15:
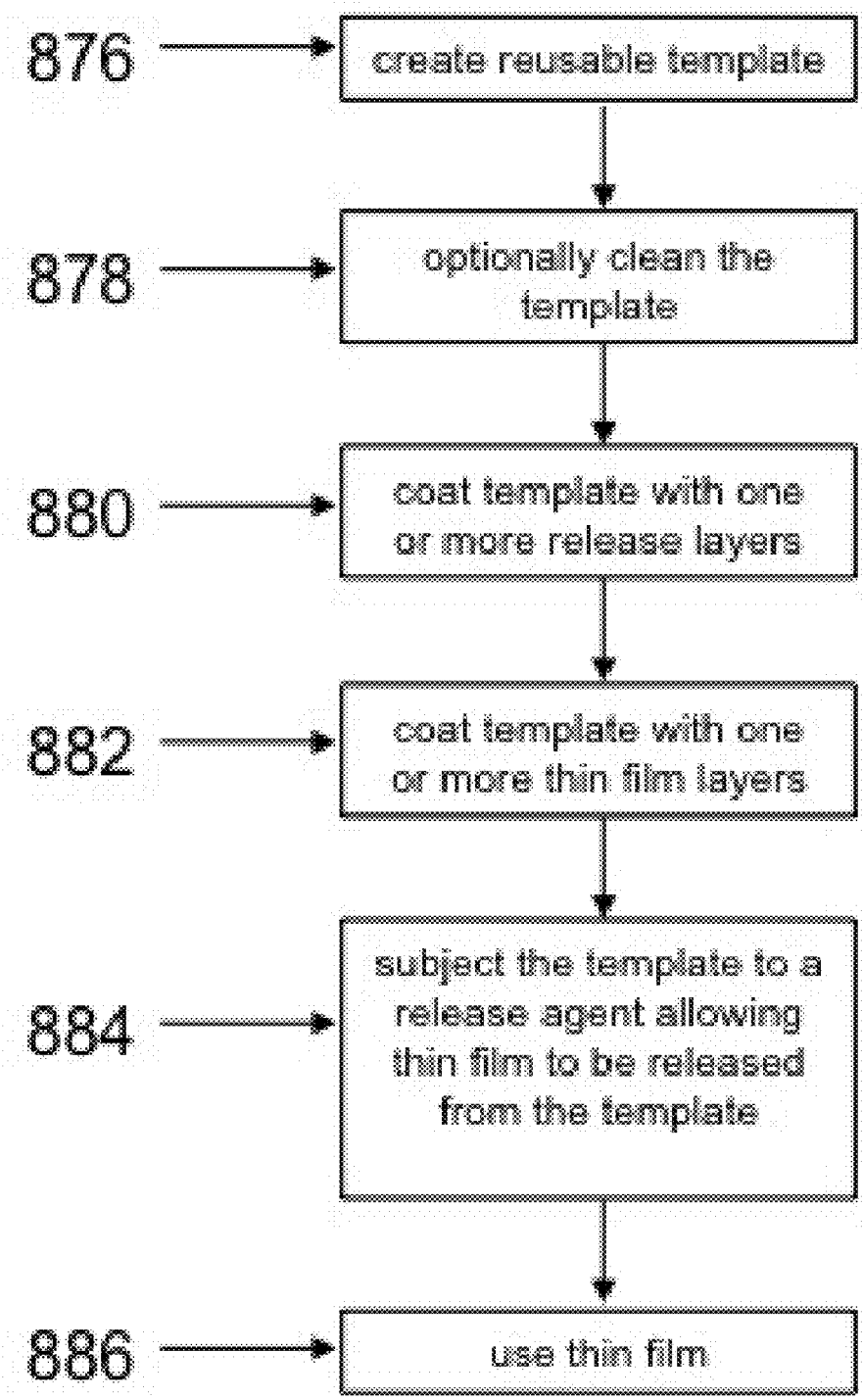
FIG. 15 describes a process of use of the novel thin film template described herein and a method of creating thin films according to a preferred embodiment of the invention.

Referring now to FIG. 15, there is outlined a preferred process of use of the thin film template 111 described herein, and a method of creating thin films on such template. As a first step, one creates or otherwise obtains a thin film template according to the teachings of the present invention 876. Certain steps may be desired, such as cleaning the template 876 prior to use. Once the template is readied for use, the top surface of the template is coated with one or more release layers 880. The surface of the template (now coated with the release layer(s) is then coated with one or more thin film layers 882. The template, so coated, is then subjected to the presence of a release agent to allow the thin film to be released from the template 884. The thin film so produced is now ready for use or other desired processing 886.

Figure 13C:
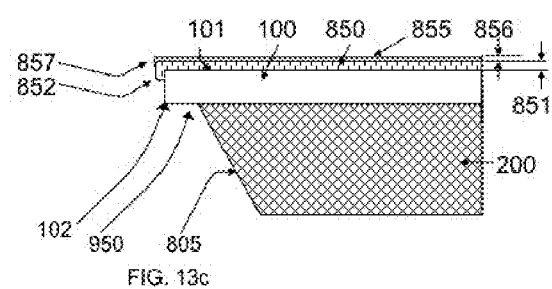
FIG. 13c is an enlarged view of the area 13c in FIG. 13b.

Referring now to FIG. 13c, once the template 111 is made, it can be used in the construction or preparation of thin films. For example, FIG. 13c illustrates the depositing of one or more release layer(s) 850 upon the template surface layer 100, the release layer having a total thickness 851. Addition of the release layer(s) 850 prepares the surface of the template 101 to receive one or more deposited thin film material(s) 855 of total thickness 856. The presence of the undercut profile 950 of the surface material 100 by the substrate material 200 prevents both the release layer(s) 850 and the thin film layer (s) 855 from continuously coating the surface of the template. Thus a discontinuity is formed in both the release layer 850 and the thin film layer 855 in the zone of the undercut profile 950 causing the pattern of the template to be transferred into the release layer(s) 850 and the thin film layer(s) 855. As the release layer(s) 850 and the thin film layer(s) 855 are deposited, they will possibly extend beyond the edges of the patterned features 102 of the surface material 100 and form a collar of material 852, 857 around the edges of the patterned features 102. The extent of the collars 852, 857 can be minimized both by choosing a directional deposition method for applying the release layer(s) 850 and the thin film layer(s) 855, and by limiting the thickness of the surface material 100. As such, the release layer remains exposed so that during the step of releasing the thin film layer, the release layer can be sacrificed, e.g., by introducing the template into an aqueous solution to dissolve the release layer (where the release layer is of a water soluble material). The water will be able to reach the release layer (i.e., to get between the surface material surface 101 and the thin film 855 since the thin film layer 855 did not encapsulate the release layer 850. The use of the template structure described herein provides a novel and advantageous structure for precisely controlling the thickness of the thin film and thereby controlling the extent of the collar of the thin-film layer(s) (855).

Carbon coated grids created with the process flow using the novel thin films template of the present invention are superior to carbon coated grids processed as described in U.S. Pat. No. 6,645,744, U.S. Pat. No. 6,821,692, and Ermantraut et al., "Perforated support foils with pre-defined hole size, shape and arrangement," Ultramicroscopy 74 (1998), pp 75-81, in three fundamental ways:

The perforated carbon film resulting from the use of the invention herein would be flatter than films fabricated from prior art (U.S. Pat. No. 6,645,744, U.S. Pat. No. 6,821,692, and Ermantraut et al., "Perforated support foils with pre-defined hole size, shape and arrangement," Ultramicroscopy 74 (1998), pp 75-81). Specifically, the process by which the template film (200) is deposited can result in nearly atomically smooth surfaces, which transfers into the films manufactured using the process described herein. In addition, the template manufacture process described within allows for precise control of the thickness of layer (100), which can be made far thinner than prior art allows (ref. U.S. Pat. No. 6,645,744, U.S. Pat. No. 6,821,692, and Ermantraut et al., "Perforated support foils with pre-defined hole size, shape and arrangement," Ultramicroscopy 74 (1998), pp 75-81). This thin film and the undercut described within will minimize any "collars" (ref. Downing, "Support Films with Uniform Hole Size," Microscopy Today, 11(5), p. 54, 2003) or non-uniformities that occur in prior art (ref. U.S. Pat. No. 6,645,744, U.S. Pat. No. 6,821,692, and Ermantraut et al., "Perforated support foils with pre-defined hole size, shape and arrangement," Ultramicroscopy 74 (1998), pp 75-81) and will allow more optimal ice for cryoTEM imaging (Downing, "Support Films with Uniform Hole Size," Microscopy Today, 11 (5), p. 54, 2003).

Because the template is not consumed during the film manufacturing process described within, and because the films are completely removed from the surface of the template, contamination of the films created can be minimized. Prior processes (U.S. Pat. No. 6,645,744, U.S. Pat. No. 6,821, 692, and Ermantraut et al., "Perforated support foils with pre-defined hole size, shape and arrangement," Ultramicroscopy 74 (1998), pp 75-81) can result in carbon containing resides left on the surface of the films (ref. Downing, "Support Films with Uniform Hole Size," Microscopy Today, 11(5), p. 54, 2003.) The template process described within will minimize or eliminate these forms of contamination, resulting in more optimal ice formation for cryoTEM imaging (see Harris, "Carbonaceous Contaminants on Support Films for Transmission Electron Microscopy," Carbon, 39(6), pp 909-913, 2001 and Downing, "Support Films with Uniform Hole Size," Microscopy Today, 11 (5), p. 54, 2003).

The carbon coated grids that can be created from the use of the invention described herein are clean by construction since the template itself can be aggressively cleaned (e.g. with acids, solvents, and/or oxygen plasma) and the surface of the thin carbon film upon which a sample will be in contact is not exposed to contaminates during the grid formation process. The cleanliness of carbon coated grids for EM created from the use of the invention described herein are superior to EM grids available in prior art due to the known contamination problems of prior art EM grids (see Harris, "Carbonaceous Contaminants on Support Films for Transmission Electron Microscopy," Carbon, 39(6), pp 909-913, 2001 and Downing, "Support Films with Uniform Hole Size," Microscopy Today, 11 (5), p. 54, 2003).

The following represents an exemplary list of references.

| U.S. Patent References | | | | |
|---|---|---|---|---|
| [1] | 2,347,965 | May 1944 | Ramberg | 250/49.5 |
| [2] | 2,572,497 | October 1951 | Law | 18/57 |
| [3] | 2,875,341 | February 1959 | Nesh | 250/49.5 |
| [4] | 4,250,127 | February 1981 | Warren, et al. | 264/22 |
| [5] | 5,004,920 | April 1991 | Lee, et al. | 250/304 |
| [6] | 6,645,744 | November 2003 | Ermantraut, et al. | 435/183 |
| [7] | 6,821,692 | November 2004 | Ermantraut, et al. | 430/17 |

Other references

[8] Ermantraut, E; Wolfhart, K; and Tichelaar, W, "Perforated support foils with pre-defined hole size, shape and arrangement," Ultramicroscopy 74 (1998), pp 75-81.

[9] Downing, K, "Support films with Uniform Hole Size," Microscopy Today, 11(5), p. 54, 2003.

[10] Harris, P, "Carbonaceous Contaminants on Support Films for Transmission Electron Microscopy," Carbon, 39(6), pp 909-913, 2001

As can be learned from the disclosures herein, a novel method of making thin film templates has been disclosed. The templates created by the process described herein are reuseable. Additionally, there is described herein a novel template structure that is re-useable for creation of thin films. The use of the template for making thin films, as well as the thin films themselves are objects of the present invention. Furthermore, end use applications for using thin films created using the present invention are also the subject of the present invention.

All references referred to herein are incorporated herein by reference. While the apparatus and methods of this invention have been described in terms of preferred embodiments, it will be apparent to those of skill in the art that variations may be applied to the process and system described herein without departing from the concept and scope of the invention. All such similar substitutes and modifications apparent to those skilled in the art are deemed to be within the scope and concept of the invention. Those skilled in the art will recognize that the method and apparatus of the present invention has many applications, and that the present invention is not limited to the representative examples disclosed herein. Moreover, the scope of the present invention covers conventionally known variations and modifications to the system components described herein, as would be known by those skilled in the art. While the apparatus and methods of this invention have been described in terms of preferred or illustrative embodiments, it will be apparent to those of skill in the art that variations may be applied to the process described herein without departing from the concept and scope of the invention. All such similar substitutes and modifications apparent to those skilled in the art are deemed to be within the scope and concept of the invention as it is set out in the following claims.

What is claimed is:

1. A reusable template for use in creating thin films comprising:
   (a) a base structure comprising a substrate and a surface layer, wherein the surface layer has a topside, an underside and a thickness;
   (b) one or more apertures in the surface layer of the base structure, said one or more apertures having an aperture shape defining an aperture perimeter boundary;
   (c) one or more cavities having cavity walls in the substrate of the base structure; and
   (d) one or more undercuts, wherein each undercut comprises a region of the surface layer forming a lip at the aperture perimeter boundary, wherein the lip comprises the topside and thickness of the surface layer and an underside face having an inner boundary and an outer boundary, wherein the outer boundary of the underside face corresponds to the aperture perimeter boundary and the inner boundary contacts the walls of the cavity.

2. The reusable template of claim 1 comprising a plurality of apertures, said plurality of apertures being oriented in spaced relationship with one another.

3. The reusable template of claim 2 wherein said plurality of apertures are arranged in a regular array of aperture shapes.

4. The reusable template of claim 1 wherein the substrate comprises an amorphous material.

5. The reusable template of claim 1 wherein the substrate comprises a crystalline material.

6. The reusable template of claim 5 wherein the crystalline material comprises silicon.

7. The reusable template of claim 1 wherein the underside of said surface layer is in contact with the substrate.

8. The reusable template of claim 1, wherein the aperture shape is circular, conical, square or hexagonal.

9. The reusable template of claim 1, wherein the one or more cavities are positioned directly underneath the surface layer proximate a radius of the aperture perimeter boundary.

10. The reusable template of claim 1 wherein said lip underside face has a length defined as the distance between said outer and inner boundaries.

11. The reusable template of claim 1 wherein said lip underside face inner boundary contacts said cavity walls in a region where said cavity walls have a substantially retrograde slope.

12. The reusable template of claim 1 wherein said lip underside face inner boundary contacts said cavity walls in a region where said cavity walls have a substantially re-entrant slope.

13. A method of manufacturing reusable thin film templates comprising the steps of:
(a) creating a thin film template workpiece having one or more layers of desired composition, said workpiece comprising a substrate and a surface layer, wherein the surface layer has a topside, an underside and a thickness;
(b) transferring patterned features from a pattern master into the surface layer of the template workpiece to create one or more patterned apertures having an aperture shape defining an aperture perimeter boundary; and
(c) creating one or more cavities having cavity walls in the substrate,
wherein the workpiece comprises one or more undercuts, wherein each undercut comprises a region of the surface layer forming a lip at the aperture perimeter boundary, wherein the lip comprises the topside and thickness of the surface layer and an underside face having an inner boundary and an outer boundary, wherein the outer boundary of the underside face corresponds to the aperture perimeter boundary and the inner boundary contacts the walls of the cavity.

14. The method of claim 13 wherein
said surface layer underside is in contact with said substrate.

15. The method of claim 13, wherein the aperture shape is circular, conical, square or hexagonal.

16. The method of claim 13, wherein the one or more cavities are positioned directly underneath the surface layer proximate a radius of the aperture perimeter boundary.

17. The method of claim 13 wherein
said lip underside face has a length defined as the distance between said outer and inner boundaries.

18. The method of claim 13 wherein said lip underside face inner boundary contacts said cavity walls in a region where said cavity walls have a substantially retrograde slope.

19. The method of claim 13 wherein said lip underside face inner boundary contacts said cavity walls in a region where said cavity walls have a substantially re-entrant slope.

20. The method of claim 13, wherein said step (b) comprises:
(i) applying a photoresist layer to the surface layer of the workpiece;
(ii) placing a photomask, containing one or more desired array of patterned apertures, proximate the surface of the photoresist layer;
(iii) transferring the patterned features of the photomask into the photoresist layer;
(iv) developing the photoresist layer, thereby exposing the surface layer of the workpiece in the area of the patterned apertures;
(v) removing the photomask from proximity with the workpiece.

21. The method of claim 20 including the step of removing, if not previously removed, the photoresist layer.

22. A thin film template obtained by the process of: (a) creating a thin film template workpiece having one or more layers of desired composition, said workpiece comprising a substrate and a surface layer, wherein the surface layer has a topside, an underside and a thickness (b) transferring patterned features from a pattern master into the surface layer of the template workpiece to create one or more patterned apertures having an aperture shape defining an aperture perimeter boundary; and (c) creating one or more cavities having cavity walls in the substrate, wherein the workpiece comprises one or more undercuts, wherein each undercut comprises a region of the surface layer forming a lip at the aperture perimeter boundary, wherein the lip comprises the topside and thickness of the surface layer and an underside face having an inner boundary and an outer boundary, wherein the outer boundary of the underside face corresponds to the aperture perimeter boundary and the inner boundary contacts the walls of the cavity.

23. A thin film template obtained by the process of: (a) creating a thin film template workpiece having one or more layers of desired composition, said workpiece comprising a substrate and a surface layer, wherein the surface layer has a topside, an underside and a thickness; (b) applying a photoresist layer to the top surface of the workpiece; (c) placing a photomask, containing one or more desired array of patterned features, proximate the surface of the photoresist layer; (d) transferring the patterned features of the photomask into the photoresist layer such that the photoresist layer is now absent in the area of the patterned features, thereby exposing the top surface of the workpiece in the area of the patterned features; (e) removing the photomask from proximity with the workpiece; (f) transferring the patterned features into the surface layer of the template workpiece to create one or more patterned apertures having an aperture shape defining an aperture perimeter boundary; (g) optionally removing the photoresist layer; (h) creating one or more cavities and one or more undercuts, wherein each undercut comprises a region of the surface layer forming a lip at the aperture perimeter boundary, wherein the lip comprises the topside and thickness of the surface layer and an underside face having an inner boundary and an outer boundary, wherein the outer boundary of the underside face corresponds to the aperture perimeter boundary and the inner boundary contacts the walls of the cavity; and (i) removing, if desired and not already removed, the photoresist layer.

24. A method of manufacturing thin films comprising the steps of:
(i) coating a reuseable thin film template with a release layer;
(ii) applying the desired thin film to the release layer; and
(iii) releasing the thin film from the release layer without sacrificing the structural integrity of the thin film template such that the thin film template remains available for at least one re-use;
said reusable thin film template comprising:
(a) a base structure comprising a substrate and a surface layer, wherein the surface layer has a topside, an underside and a thickness;
(b) one or more apertures in the surface layer of the base structure; said one or more apertures having an aperture shape defining an aperture perimeter boundary;
(c) one or more cavities having cavity walls in the substrate of the base structure; and
(d) one or more undercuts, wherein each undercut comprises a region of the surface layer forming a lip at the aperture perimeter boundary, wherein the lip comprises the topside and thickness of the surface layer and an underside face having an inner boundary and an outer boundary, wherein the outer boundary of the underside face corresponds to the aperture perimeter boundary and the inner boundary contacts the walls of the cavity.

25. The method of manufacturing thin films according to claim 24 comprising the additional step of attaching the thin films so produced to an electron microscopy sample grid.

26. The method of manufacturing thin films according to claim 24 wherein the releasing step comprises exposing the release layer to a material that selectively attacks the release layer without substantially attacking the thin film layer or the reusable thin film template.

27. The method of manufacturing thin films according to claim 24 wherein the release layer is comprised of one or more materials that are deposited upon the template by vacuum deposition techniques.

28. The method of manufacturing thin films according to claim 24 wherein the thin film layer is comprised of one or more materials that are deposited upon the release layer by vacuum deposition techniques.

29. The method of manufacturing thin films according to claim 24 comprising the additional steps of repeating steps (i)-(iii).

30. The reusable template of claim 7, wherein the surface layer comprises silicon nitride.

31. The reuseable template of claim 7, wherein the substrate comprises silicon.

32. The reuseable template of claim 1, wherein the aperture shape is circular.

33. The reuseable template of claim 1, wherein the one or more cavities have a retrograde and re-entrant cross-sectional profile.

34. The reuseable template of claim 1, wherein the one or more cavities have a cross sectional anisotropic profile.

35. The method of manufacturing thin films according to claim 24, wherein the release layer comprises a material selected from the group consisting of carbon, gold, silver, beryllium, copper, nickel, aluminum, and tungsten.

36. The method of manufacturing thin films according to claim 24, wherein the thin film comprises a material selected from the group consisting of carbon, gold, silver, beryllium, copper, nickel, aluminum, and tungsten.

* * * * *